US012792797B2

(12) United States Patent
Harris et al.

(10) Patent No.: US 12,792,797 B2
(45) Date of Patent: *Nov. 10, 2026

(54) COMPREHENSIVE CONTENTION-BASED THREAD ALLOCATION AND PLACEMENT

(71) Applicant: Oracle International Corporation, Redwood City, CA (US)

(72) Inventors: Timothy L Harris, Cambridge (GB); Daniel J. Goodman, Bagillt (GB)

(73) Assignee: Oracle International Corporation, Redwood City, CA (US)

( * ) Notice: Subject to any disclaimer, the term of this patent is extended or adjusted under 35 U.S.C. 154(b) by 48 days.

This patent is subject to a terminal disclaimer.

(21) Appl. No.: 18/465,020

(22) Filed: Sep. 11, 2023

(65) Prior Publication Data

US 2023/0418997 A1 Dec. 28, 2023

Related U.S. Application Data

(63) Continuation of application No. 15/691,530, filed on Aug. 30, 2017, now Pat. No. 11,861,272.

(Continued)

(51) Int. Cl.
*G06F 30/20* (2020.01)
*G06F 9/50* (2006.01)

(52) U.S. Cl.
CPC ............ *G06F 30/20* (2020.01); *G06F 9/5066* (2013.01)

(58) Field of Classification Search
CPC .......... G06F 30/20; G06F 30/25; G06F 30/27; G06F 30/28; G06F 9/5066; G06F 8/451
See application file for complete search history.

(56) References Cited

U.S. PATENT DOCUMENTS

2009/0064167 A1* 3/2009 Arimilli .................. G06F 9/522 718/105
2010/0058346 A1* 3/2010 Narang ................. G06F 9/5066 718/102

(Continued)

OTHER PUBLICATIONS

Pusukuri, Kishore Kumar, Rajiv Gupta, and Laxmi N. Bhuyan. “Thread reinforcer: Dynamically determining numberf of threads via os level monitoring.” 2011 IEEE International Symposium on Workload Characterization (IISWC). IEEE, 2011. (Year: 2011).*

(Continued)

*Primary Examiner* — Michael Edward Cocchi
(74) *Attorney, Agent, or Firm* — Robert C. Kowert; Kowert, Hood, Munyon, Rankin & Goetzel, P.C.

(57) ABSTRACT

A system configured to implement Comprehensive Contention-Based Thread Allocation and Placement, may generate a description of a workload from multiple profiling runs and may combine this workload description with a description of the machine's hardware to model the workload's performance over alternative thread placements. For instance, the system may generate a machine description based on executing stress applications and machine performance counters monitoring various performance indicators during execution of a synthetic workload. Such a system may also generate a workload description based on profiling sessions and the performance counters. Additionally, behavior of a workload with a proposed thread placement may be modeled based on the machine description and workload description and a prediction of the workload's resource demands and/or performance may be generated.

20 Claims, 9 Drawing Sheets

Related U.S. Application Data

(60) Provisional application No. 62/410,774, filed on Oct. 20, 2016.

(56) References Cited

U.S. PATENT DOCUMENTS

2010/0183028 A1* 7/2010 Howard ................ G06F 9/5066 370/468
2016/0026741 A1* 1/2016 Kuwamura ............. G06F 30/20 703/2
2018/0113965 A1 4/2018 Harris et al.

OTHER PUBLICATIONS

Baptiste Lepers, et al, "Thread and Memory Placement on NUMA Systems: Asymmetry Matters", USENIX, Proceedings of the 2015 USENIX Annual Technical Conference (Usenic ATC'15), Jul. 8-10, 2015, pp. 1-14 (Year: 2015).*
Alexander Collins, et al., "LIRA: Adaptive Contention-Aware Thread Placement for Parallel Runtime Systems", ROSS '15 Proceedings of the 5th International Workshop on Runtime and Operating Systems for Supercomputers, 2015, pp. 1-9 (Year: 2015).*
Major Bhadauria, et al, "AN Approach to Resource-Aware Co-Scheduling for CMPs", ACM, ICS'10, Jun. 2-4, 2010, pp. 1-11 (Year: 2010).*
C. Alvarado, D. Tamir and A. Qasem, "Realizing energy-efficient thread affinity configurations with supervised learning," 2015 Sixth International Green and Sustainable Computing Conference (IGSC), Las Vegas, NV, 2015, pp. 1-4, doi: .1109/IGCC.2015.7393691 . (Year: 2015).*
Jiang Lin, Qingda Lu, Xiaoning Ding, Zhao Zhang, Xiaodong Zhang and P. Sadayappan, "Gaining insights into multicore cache partitioning: Bridging the gap between simulation and real systems," 2008 IEEE 14th International Symposium on High Performance Computer Architecture, 2008, pp. 367-378 (Year: 2008).*
Rogers, Timothy G., Mike O'Connor, and Tor M. Aamodt. "Divergence-aware warp scheduling." Proceedings of the 46th Annual IEEE/ACM International Symposium on Microarchitecture. 2013. (Year: 2013).*
Eytani, Yaniv, et al. "Towards a framework and a benchmark for testing tools for multi-threaded programs." Concurrency and Computation: Practice and Experience 19.3 (2007): 267-279. (Year: 2007).*
Zhuravlev, Sergey, Sergey Blagodurov, and Alexandra Fedorova. "AKULA: a toolset for experimenting and developing thread placement algorithms on multicore systems." Proceedings of the 19th international conference on Parallel architectures and compilation techniques. 2010. (Year: 2010).*
Tanima Dey, et al., "ReSense: Mapping Dynamic Workloads of Colocated Multithreaded Applications Using Resource Sensitivity," ACM Transactions on Architecture and Code Optimization, vol. 10, No. 4, Article 41, Dec. 12, 2013, pp. 1-26.
Yan Solihin, et al., "Scal-Tool: Pinpointing and Quantifying Scalability Bottlenecks in DSM Multiprocessors," SC '99: Proceedings of the 1999 ACM/IEEE Conference on Supercomputing, Nov. 1999, pp. 1-13.
Robert L. McGregor, et al. "Scheduling Algorithms for Effective Thread Pairing on Hybrid Multiprocessors," Proceedings of the 19th IEEE International Parallel and Distributed Processing Symposium (IPDPS 2005), pp. 1-10.
Yuejian Xie, et al., "Dynamic Classification of Program Memory Behaviors in CMPs," In the 2nd Workshop on CMP Memory Systems and Interconnects (CMP-MSI), Jun. 2008, pp. 1-9.
Andreas Merkel, et al., "Resource-conscious Scheduling for Energy Efficiency on Multicore Processors", ACM, EuroSys'10, Apr. 13-16, pp. 1-14.
Dhruba Chandra, et al., "Predicting Inter-Thread Cache Contention n a Chip Multi-Processor Architecture", Proceeding on the 11th International Symposium on High-Performance Computer Architecture (HPCA-11 2005), 2005, pp. 1-12.
Laura Carrington, et al., "A Performance Prediction Framework for Scientific Applications", Computational Science—ICCS 2003, pp. 1-10.
Xiao Zhang, et al., "CPI2: CPU performance isolation for shared compute clusters", ACM, Eurosys'13, Apr. 15-17, 2013, pp. 1-13.
Ripal Nathuji, et al., "Q-Clouds: Managing Performance Interference Effects for QoS-Aware Clouds", ACM, EuroSys'10, Apr. 13-16, 2010, pp. 1-14.
Sergey Zhuravlev, et al., "Addressing Shared Resource Contention in Multicore Processors via Scheduling", ACM, ASPLOS'10, Mar. 13-17, 2010, pp. 1-13.
Baptiste Lepers, et al., "Thread and Memory Placement on NUMA Systems: Asymmetry Matters", USENIX, Proceedings of the 2015 USENIX Annual Technical Conference (USENIC ATC'15), Jul. 8-10, 2015, pp. 1-14.
Cagri Balkesen, et al., "Main-Memory Hash Joins on Multi-Core CPUs: Tuning to the Underlying Hardware", In Data Engineering (ICDE), 2013 IEEE 29th International Conference on, pp. 362-373.
Jiang Lin, "Gaining Insights into Multi-Core Cache Partitioning: Bridging the Gap between Simulation and Real Systems", PowerPoint, Department of ECE and Department of CSE, pp. 1-34.
Richard West, et al., "Online Cache Modeling for Commodity Multicore Processors", ACM, PACT'10, Sep. 11-15, 2010, pp. 1-2.
Tim Harris, et al., "Callisto-RTS: Fine-Grain Parallel Loops", USENIX, Proceedings of the 2015 USENIX Annual Technical Conference (USENIC ATC'15), Jul. 8-10, 2015, pp. 1-13.
Georgios Chatzopoulos, et al., "ESTIMA: Extrapolating Scalability of In-Memory Applications", ACM, PPoPP'16, Mar. 12-16, 2016, pp. 1-11.
Jean-Pierre Lozi, et al., "The Linux Scheduler: a Decade of Wasted Cores", Proceedings of the Eleventh European Conference on Computer Systems, EuroSys 2016, Apr. 2016, pp. 1-16.
Gaurav Dhiman, et al., "vGreen: A System for Energy-Efficient Management of Virtual Machines", ACM Transaction on Design Automation of Electronic Systems, vol. 16, No. 1. Article 6, Nov. 2010, pp. 1-27.
Bradley J. Barnes, et al., "A Regression-Based Approach to Scalability Prediction", ACM, ICS'08, Jun. 7-12, 2008, pp. 1-10.
Major Bhadauria, et al, "AN Approach to Resource-Aware Co-Scheduling for CMPs", ACM, ICS'10, Jun. 2-4, 2010, pp. 1-11.
Alexandra Fedorova, et al., "Improving Performance Isolation on Chip Multiprocessors via an Operating System Scheduler", Proceedings of the 16th International Conference on Parallel Architecture and Compilation Techniques, IEEE Computer Society, pp. 1-12.
Alexander Collins, et al., "LIRA: Adaptive Contention-Aware Thread Placement for Parallel Runtime Systems", ROSS '15 Proceedings of the 5th International Workshop on Runtime and Operating Systems for Supercomputers, 2015, pp. 1-9.
Rob Knauerhase, et al., "Using OS Observations to Improve Performance in Multicore Systems", IEEE Computer Society, 2008, pp. 54-66.
Gabriel Marin, et al., "Cross-Architecture Performance Predictions for Scientific Application Using Parameterized Models", ACM, SIGMETRICS/Performance '04, Jun. 12-16, 2004, pp. 1-12.
Jidong Zhai, et al., "PHANTOM: Predicting Performance on Parallel Application on Large-Scale Parallel Machines Using a Single Node", ACM, PPoPP '10, Jan. 9-14, 2010, pp. 1-10.
D.J. Kerbyson, et al., "Predictive Performance and Scalability Modeling of a Large-Scale Application", ACM, (c) Association for Computing Machinery, 2001, pp. 1-12.
Mohammad Banikazemi, et al., "IBM Research Report—PAM: A Novel Performance/Power Aware Meta-Scheduer for Multi-Core Systems", Computer Science, RC24463 (W0801-037), Jan. 9, 2008, pp. 1-15.
"OpenMP Application Program Interface Version 3.0", OpenMP Architecture Review Board, May 2008, pp. 1-318.
D.H. Bailey, et al., "The NAS Parallel Benchmarks", National Aeronautics and Space Administration University of Nebraska, 1991, pp. 1-13.
Ahmad Yasin, "A Top-Down Method for Performance Analysis and Counters Architecture", In Performance Analysis of Systems and Software (ISPASS), 2014 IEEE International Symposium, pp. 1-10.

(56) References Cited

OTHER PUBLICATIONS

Sergey Zhuravlev, et al., "Survey of Scheduling Techniques for Addressing Shared Resources in Multicore Processors", ACM, Computing Surveys, vol. V, No. N, Sep. 2011, pp. 1-31.

Rob Knauerhase, et al., "Using OS Observations to Improve Performance in Multicore Systems", PowerPoint, pp. 1-44.

C. Alvarado, et al., "Realizing energy-efficient thread affinity configurations with supervised learning", 2015 Sixth International Green and Sustainable Computing Conference (IGSC), Las Vegas, NV, 2015, pp. 1-4, doi: 1109/IGCC.2015.7393691, (Year: 2015).

Jiang Lin, et al., "Gaining insights into multicore cache partitioning: Bridging the gap between simulation and real systems," 2008 IEEE 14th International Symposium on High Performance Computer Architecture, 2008, pp. 367-378 (Year: 2008).

Rogers, Timothy G., et al., "Divergence-aware warp scheduling." Proceedings of the 46th Annual IEEE/ACM International Symposium on Microarchitecture. 2013. (Year: 2013).

* cited by examiner

COMPREHENSIVE CONTENTION-BASED THREAD ALLOCATION AND PLACEMENT

This application is a continuation of U.S. patent application Ser. No. 15/691,530, filed Aug. 30, 2017, which claims benefit of priority of U.S. Provisional Application Ser. No. 62/410,774 titled "Comprehensive Contention-Based Thread Allocation and Placement" filed Oct. 20, 2016, the content of which are incorporated by reference herein in their entirety.

BACKGROUND

Field of the Disclosure

This disclosure relates generally to concurrent programming, and more particularly to systems and methods for modeling the performance of parallel workloads with differing thread counts and placements.

Description of the Related Art

Traditional techniques for predicting performance of a single workload may include the use of hand-built models, simulators, trace re-runs and/or fitting timing for runs with small numbers of threads to regression model. These traditional techniques frequently take longer to construct, use and/or are unable to handle thread placement.

Figure 1:
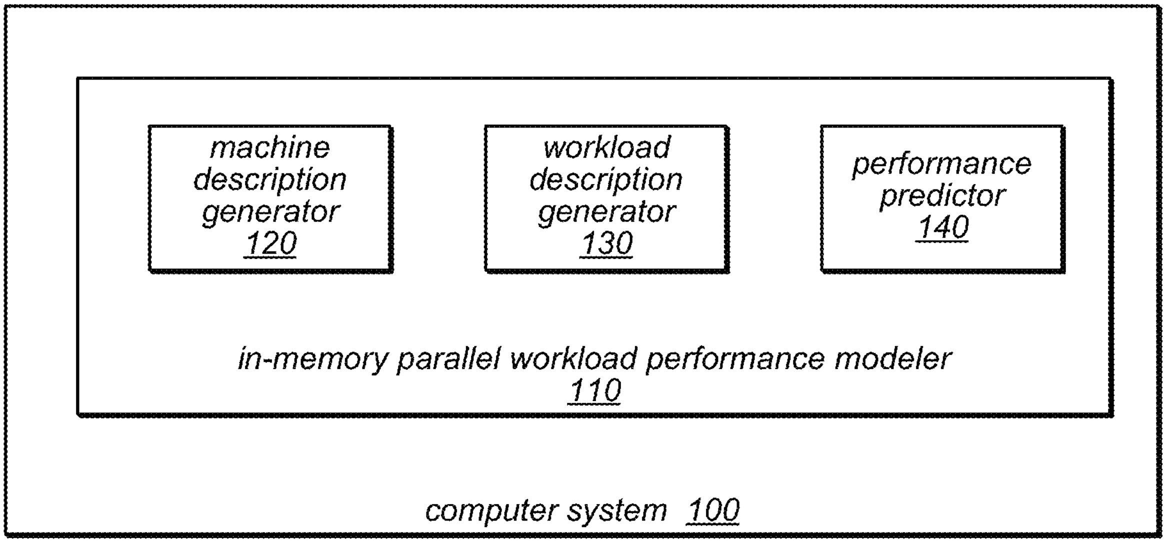
FIG. 1 is a logical block diagram illustrating a system configured to implement one embodiment of Comprehensive Contention-Based Thread Allocation and Placement, as described herein.

While the disclosure is described herein by way of example for several embodiments and illustrative drawings, those skilled in the art will recognize that the disclosure is not limited to embodiments or drawings described. It should be understood that the drawings and detailed description hereto are not intended to limit the disclosure to the particular form disclosed, but on the contrary, the disclosure is to cover all modifications, equivalents and alternatives falling within the spirit and scope as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

SUMMARY

Described herein are systems, methods, mechanisms and techniques for implementing Comprehensive Contention-Based Thread Allocation and Placement. Comprehensive Contention-Based Thread Allocation and Placement, as described herein, may include scheduling multi-threaded workloads in which a configurable number of threads run concurrently.

Comprehensive Contention-Based Thread Allocation and Placement may be used, in some embodiments, to optimize performance of a given workload, such as for instance, identifying whether multiple sockets should be used, and whether a given workload may benefit from using multiple threads per core. In addition, the techniques described herein may be used to identify opportunities for reducing resource consumption where additional resources are not matched by additional performance, such as for instance, limiting a workload to a small number of cores when its scaling is poor, according to various embodiments.

A system configured to implement Comprehensive Contention-Based Thread Allocation and Placement may predict the performance of parallel workloads on shared-memory multi-core/multi-socket machines and may select how many threads to use when running a given workload. Additionally, systems described herein may determine where to place these threads within the machine (e.g., on which CPU and/or sockets on which to execute thread). For example, some workloads may benefit from having their threads kept within a single CPU in a multi-core/multi-socket machine whereas other workloads may benefit from being spread widely across multiple sockets. Additionally, some workloads may benefit from using multiple hardware threads in each core, whereas others may not. Thus, a system implementing Comprehensive Contention-Based Thread Allocation and Placement may determine where to place threads for a given workload with a given system, according to various example embodiments.

A system configured to implement Comprehensive Contention-Based Thread Allocation and Placement, may generate a description of a workload from multiple profiling runs and may then combine this workload description with a description of the machine's hardware to model the workload's performance over thousands of alternative thread placements, according to one embodiment.

The systems, methods, mechanisms and/or techniques described herein, may include modeling the complete machine as (i.e., in terms of) resources with different bandwidths between them. For instance, the links between caches and memory may have bandwidths reflecting possible transfer rates. Similarly, CPU cores may have pipelines modeled by rates at which instructions can be fetched into the processor and the rates at which different kinds of instruction can be completed, according to various embodiments.

The systems, methods, mechanisms and/or techniques described herein may also include characterizing a workload's performance, such as by utilizing one or more profiling techniques, according to various embodiments. For example, a system configured to implement Comprehensive Contention-Based Thread Allocation and Placement may determine the use of different functional units by observing behavior of test programs co-scheduled on the same cores, and/or quantifying the impact of inter-socket and inter-core communication, according to some embodiments.

A system configured to implement Comprehensive Contention-Based Thread Allocation and Placement may generate a machine description based on executing stress applications and machine performance counters monitoring various performance indicators during execution of a synthetic workload. Such a system may also generate a workload description based on profiling sessions and the performance counters. Additionally, behavior of a workload with a proposed thread placement may be modeled based on the machine description and workload description and a prediction of the workload's resource demands and/or performance may be generated.

DETAILED DESCRIPTION OF EMBODIMENTS

Comprehensive Contention-Based Thread Allocation and Placement is described herein mainly using examples from in-memory graph analytics, in-memory parallel join operations (database kernels), along with traditional parallel computing workloads such as those using the OpenMP runtime system or other parallel runtime systems. For brevity, these may be referred to herein as "analytics workloads". In some embodiments, performance of analytics workloads may be determined primarily by the processor(s) and the memory system. For instance, data may remain in memory and there may be little use of I/O devices or system calls into the operating system. Furthermore, the number of active threads may be selected to optimize performance (in contrast, say, to a general-purpose workload where a program may create distinct threads for distinct tasks).

For example, manual configuration may frequently be used, such as to select the number of threads to create and/or to determine how to place them in the machine. For instance, in one example embodiment using OpenMP, there are settings to select whether threads are placed on nearby cores or distributed across many cores. Similarly, Solaris provides "thread affinity groups" to allow a program to indicate these kinds of preference with a high degree of flexibility. These features may allow a workload to control its scheduling, but may not automate the selection of a good scheduling policy.

Additionally, workloads may be selected which will perform either well or poorly when sharing these specific resources within a machine. These techniques may be useful when deciding when to co-locate workloads, however, the techniques described herein may apply to the threads within a single workload (such as threads handling part of the same parallel query within a server system), according to some embodiments.

As noted above, a system configured to implement Comprehensive Contention-Based Thread Allocation and Placement, which may be referred to herein as "the system", may generate a description of a workload from multiple, (e.g., 6) profiling runs, and may combine this workload description with a description of the machine's hardware to model the workload's performance over thousands of alternative thread placements, according to one embodiment. The techniques described herein may be considered "comprehensive" in that they may account for contention of multiple different resources within the machine, such as both processor functional units and memory channels. For example, the point of contention for a single workload may shift between resources as the degree of parallelism and thread placement changes. The techniques described herein may account for these changes and may provide a close correspondence between predicted performance and actual performance.

INTRODUCTION

The techniques described herein may, in some embodiments, implement a system for modeling the performance characteristics and resource demands of parallel in-memory workloads. For instance, based on multiple (e.g., 6 in some embodiments) profiling runs, a workload may be modeled and the workload's performance may be quantitatively predicted across different numbers of threads and different placements of those threads within a machine. The results of the modelling and predicting may be used to predict (and/or determine) the best thread allocation for a given workload and/or resources needed for a workload to meet a specified performance target, according to some embodiments.

FIG. 1 is a logical block diagram illustrating a system configured to implement Comprehensive Contention-Based Thread Allocation and Placement, as described herein. The illustrated computer system may model the performance of in-memory parallel workloads with differing thread counts and placements, according to one embodiment. As illustrated in FIG. 1, a computer system 100, which may in some embodiments be a multi-core system or a multi-socket system, may include an in-memory parallel workload performance modeler 110 configured to model the performance of in-memory parallel workloads with differing thread counts and placements. The in-memory parallel workload performance modeler 110 may include, and/or utilize, various components when modeling workload performance, such as machine description generator 120, workload description generator 130 and/or performance predictor 140, according to one embodiments. While illustrated in FIG. 1 as being a part of, or included within, in-memory parallel workload performance modeler 110, in some embodiments, machine description generator 120, workload description generator 130 and/or performance predictor 140 may be separate, distinct and/or external to, in-memory parallel workload performance modeler 110.

In some embodiments, computer system 100 may be configured to implement a method for Comprehensive Contention-Based Thread Allocation and Placement including, for example, generating a machine description for a system (e.g., a multi-core or multi-socket system) based on executing one or more stress applications on the system and values of one or more machine performance counters configured to monitor one or more performance indicators during execution of a synthetic workload on the system. Such method may also include generating a workload description for the system based on results from executing multiple profiling session on the system and the values of the one or more machine performance counters. Additionally, computer system 100 may be configured to model behavior of a workload with a proposed thread placement based on the machine description and the workload description. Based on results of modeling the workload behavior, computer system 100 may generate a prediction of the workload's resource demands and performance for the system.

Figure 2:
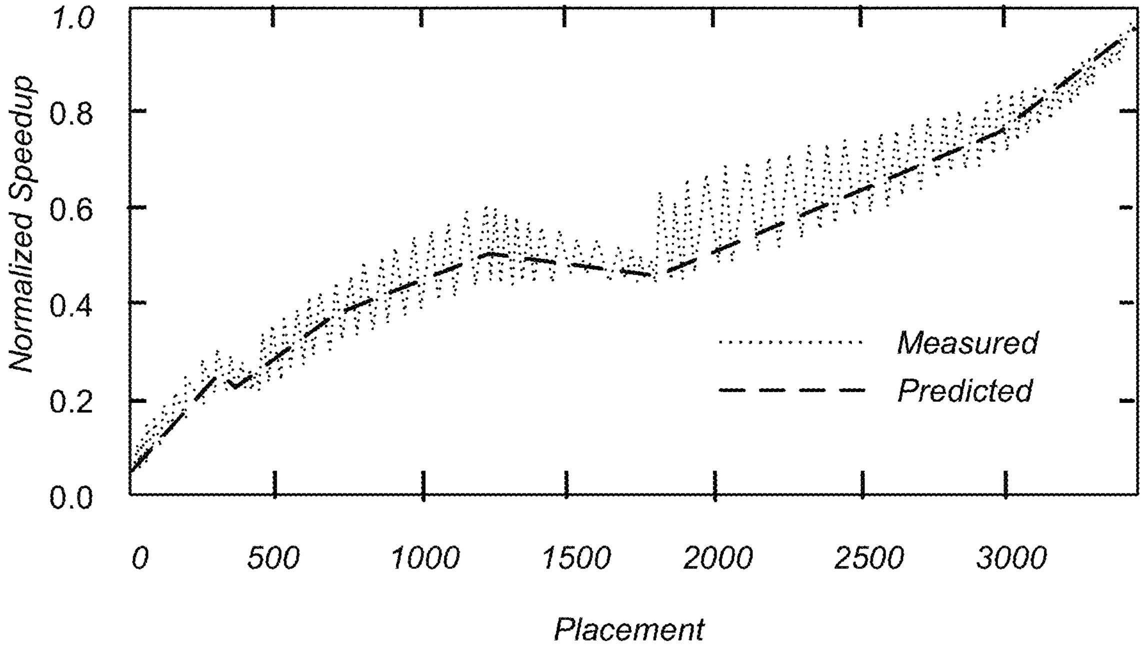
FIG. 2 is a logical block diagram illustrating an example set of results from modelling and predicting performance of in-memory parallel workloads with differing thread counts and placements collected on a molecular dynamics simulation (MD) running on a 2-socket Intel Haswell system, according to one embodiment.

FIG. 2 illustrates, according to one embodiment, an example set of results collected on a molecular dynamics (MD) simulation running on a 2-socket Intel Haswell system. FIG. 2 illustrates example predicted performance compared with measured performance for MD. The x-axis shows different thread placements with placements using the same number of threads being grouped together. The y-axis shows the performance of different thread allocations, exploring different numbers of threads and different placements of those threads on the h/w contexts in the machine. The dashed points show the measured performance of the workload when testing all of these allocations. The dotted points show the performance predicted from 6 profiling runs, according to this example embodiment.

Figure 3:
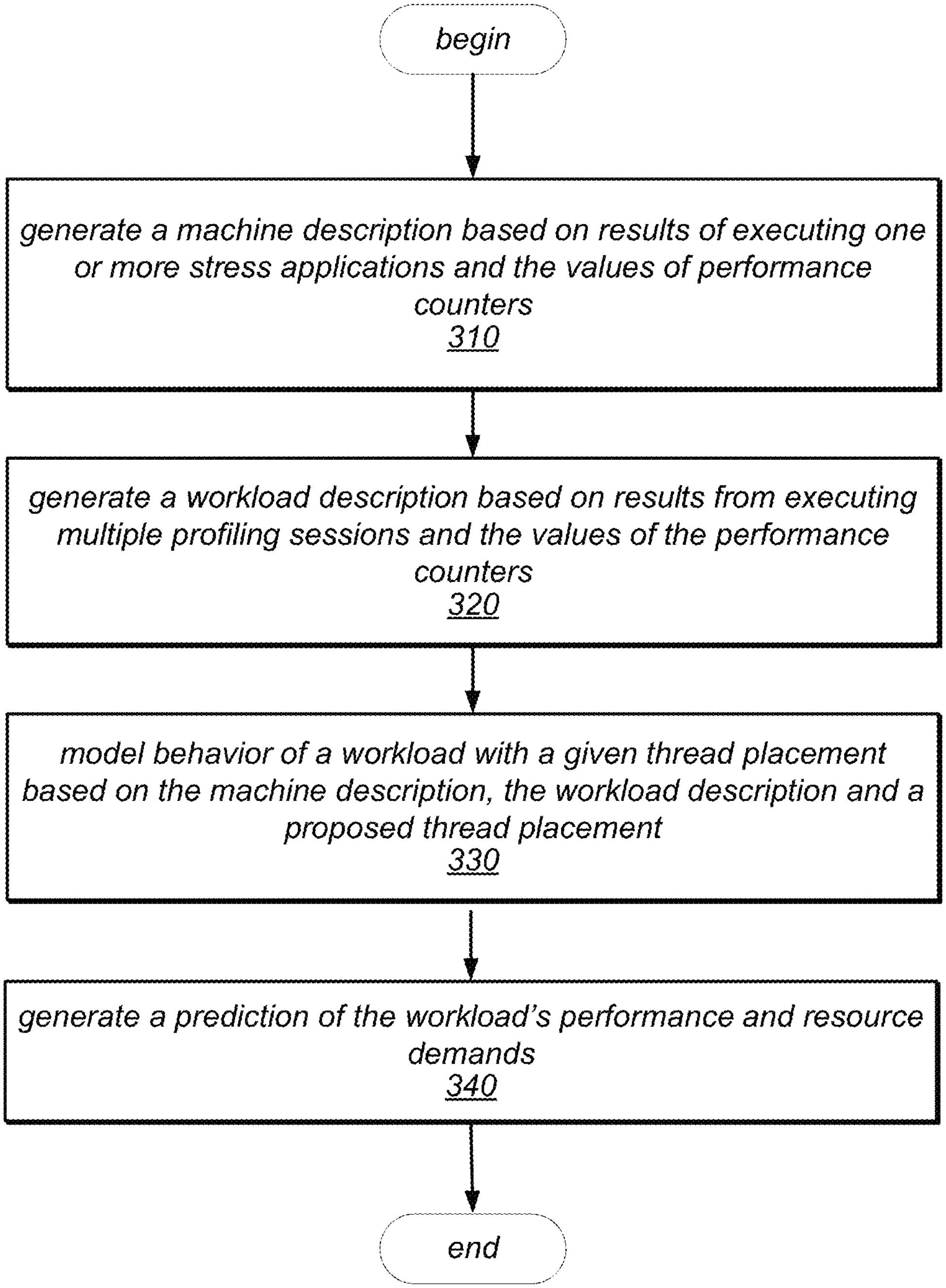
FIG. 3 is a flowchart illustrating one embodiment of a method for Comprehensive Contention-Based Thread Allocation and Placement, as described herein.

As noted above, computer system 100 may generate a machine description, generate a description of a workload, and from these model the performance of a given thread placement. FIG. 3 is a flowchart illustrating one embodiment of a method for implementing Comprehensive Contention-Based Thread Allocation and Placement as described herein. In some embodiments, computer system 100 and/or machine description generator 120 may include and/or rely on one or more stress applications, such as one or more test applications that stress the use of different resources in the machines. For instance, as illustrated by block 310, machine description generator 120 may generate a machine description based, at least in part, on results of executing one or more stress applications and/or the values of one or more performance counters. For example, in some embodiments machine description generator 120 may be, or may be considered, a collection of stress applications (e.g., one or more test applications that stress the use of different resources in the machines), that in conjunction with one or more machine performance counters may determine the structure and properties of the machine they are running on. The results of these queries may be combined into a machine description which may be used by other components.

Additionally, a workload description generator 130 may generate a workload description based, at least in part, on results from executing multiple profiling sessions and on the performance counter values, as shown in block 320. For instance, workload description generator 130 may execute a workload in multiple (e.g., 6 in some embodiments) profiling experiments during which performance counters may be monitored and the workload may be collocated with stress applications. Thereafter, a workload description may be generated modelling the particular workload.

Furthermore, a performance predictor 140 may model behavior of a workload with a given thread placement based, at least in part, on the machine description, the workload description and a proposed thread placement, as in block 330. For example, performance predictor 140 may utilize the previously generated machine description, workload description, and a proposed thread placement and model the behavior of the workload with the given thread placement. The performance predictor 140 may then proceed to generate a prediction of the workload's performance and resource demands, as in block 340.

In some embodiments, an initial assumption (possibly a naïve assumption) for a given thread placement may be used in which each thread in the parallel workload will impose the same load on the machine as a single thread from a profiling run. This load may, in some embodiments, then be iteratively refined by (i) identifying any bottleneck resources for each thread, scaling back the thread's performance accordingly, and (ii) predicting any overheads incurred by communication and synchronization, scaling back the thread's execution rate to account for these costs. Note that in some embodiments, there may be complex interactions between the demands for different resources. The load may be iteratively refined until a fixed point is reached, according to some embodiments.

The techniques described herein may also be utilized to predict performance of parallel workloads on shared-memory multi-core and/or multi-socket machines. A system configured to implement the techniques described herein may identify a set of hardware and software assumptions which permit performance predictions to be made without requiring detailed models of how the cache is implemented, or how threads will compete within it, as opposed to generating miss-rate curves, according to some embodiments. In addition, the techniques described herein may include techniques for predicting performances based on iteratively predicting the slowdowns that a workload will experience due to contention-based and/or synchronization-based overheads, according to some embodiments.

Overview

Figure 4:
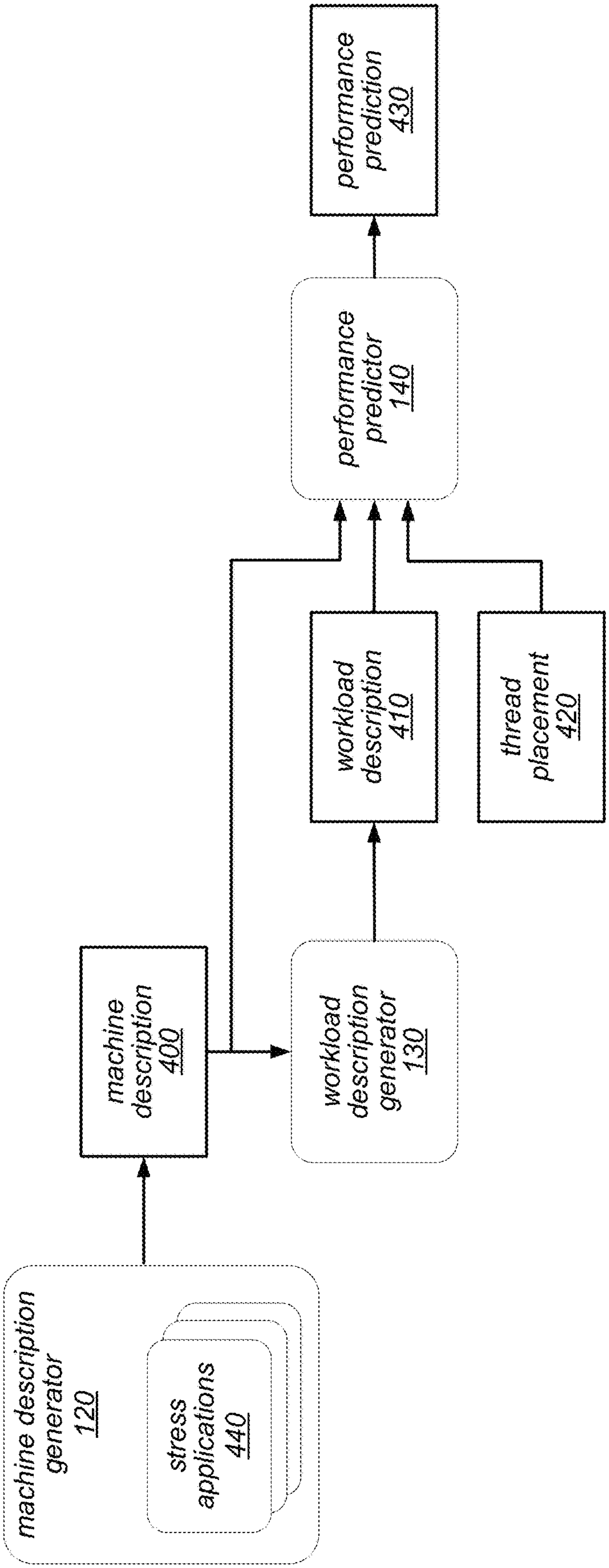
FIG. 4 is a logical block diagram illustrating three components that make up a system configured to implement Comprehensive Contention-Based Thread Allocation and Placement and the dependencies linking them, according to one embodiment.

FIG. 4 is a logical block diagram illustrating various components that may be included as part of a system configured to implement Comprehensive Contention-Based Thread Allocation and Placement as well as data flow and/or dependencies that link them, according to one embodiment.

For instance, machine description generator 120 may be, or include, a collection of stress applications 440. Machine description generator 120 may utilize the stress application in conjunction with machine performance counters to determine structure and properties of a machine on which they are executing. The results of these queries may be combined into a machine description 400 which may be used by other components. Machine descriptions may be created once for each machine, and may be independent of the workload being scheduled, according to various embodiments.

Thus, a machine description 400 may be constructed through a combination of information obtained from the operating system (OS), and measurements taken from the performance of synthetic applications, such as stress applications 440. Stress applications 440 may be configured (e.g., either individually or collectively) to stress particular resources of the system. In some embodiments, the OS may provide various types of information, such as the number of processor sockets, cores per socket and hardware threads per core as well as the structure of links between each level in the cache hierarchy, the topology of the interconnect between the sockets, and/or locations of links to main memory. The OS-provided information may then be combined with performance measurements from the stress applications, such as describing the bandwidth of different links in the memory system as well as the performance of the cores, to generate the machine description 400, according to some embodiments. Additionally, in some embodiments rather than being measured (e.g., by the one or more stress applications) the performance measurements may be provided by the OS (e.g., along with the topology of the machine) or they may be configured manually for the machine.

Workload description generator 130 may execute a workload in multiple (e.g., 6 in some embodiments) profiling experiments. During profile experiments, performance counters may be monitored and the workload may be collocated with stress applications. A workload description 410 modelling the particular workload may then be generated. In some embodiments, information required to model a given workload may be collected and encoded in workload description 410. Workload description 410 may be specific to a given workload on a given machine and thus may be regenerated when moving a workload to different hardware.

Performance predictor 140 may take machine description 400, workload description 410, and a proposed thread placement 420 and may use them to model the behavior of the workload with the given thread placement, and provide a performance prediction 430 of the workload's resource demands and performance. In some embodiments, performance prediction 430 may be constructed from a combination of an anticipated speed-up assuming perfect scaling of parallel sections of the workload and a slowdown reflecting the impact of resource contention and synchronization. Performance predictor 140 may proceed iteratively until reaching stable prediction.

In some embodiments, the aspects of a modeled workload may be split into multiple groups, including, but not limited to, resource demands, parallel fraction, inter-socket latency, load balancing factors, core burstiness, and/or thread utilization, as summarized below.

Resource demands. The hardware resources expected to be consumed by threads may be modeled. These resources may include bandwidths at each level of the memory hierarchy as well as the compute resources within a core.

Parallel fraction. How the workload is expected to scale (e.g., an expected workload scaling) with a thread count of n in the absence of other constraints may also be modeled. This scaling may, in some embodiments, be provided by Amdahl's law, such as based on the notion that some fraction of the execution p is parallel and the rest is serial:

$$\text{Speedup} = \frac{1}{(1-p) + \frac{p}{n}}$$

Inter-socket latency. Bandwidth consumed by inter-socket communication may be recorded as part of the resource demands, but latency introduced by inter-socket communication may also be modeled. When threads access shared memory locations the performance may depend on the relative locations of the threads, if atomic operations are used, if there is any sharing, and if so what kind, such as false or genuine sharing. This variation may make it unfeasible, in some embodiments, to model the detailed interactions at the hardware level.

These effects may be measured in aggregate for a workload by determining the workload's sensitivity to having its threads placed on different sockets. This may capture the sensitivity of the workload it is to such costs, and the actual latencies introduced by the hardware, according to some embodiments. For instance, if threads communicate rarely the values may remain low even if the hardware introduces high latencies between sockets, according to some embodiments.

Load balancing factor. In cases where threads are not placed symmetrically it may be important to determine the effect on the overall speed of a workload if some threads slow down more than others. For example, some workloads may use static work distribution in which if a slow thread becomes a straggler, it may delay completion of the complete workload. In such a case each thread may perform an equal amount of work, but the time individual threads spend performing the work may differ. Other workloads may use work stealing to distribute work dynamically between threads, possibly allowing any slowness by one thread to be compensated for by other threads picking up its work. In this case the overall performance of the workload may be determined by the aggregate throughput of all of its threads as threads may be active for the same amount of time, but some threads may be making progress more quickly than others. In practice, workloads may be somewhere between these points. In some embodiments, this may be expressed by a load balancing factor indicating where a workload lies between these extremes.

Core burstiness. Core burstiness may quantify the extent to which the workload's demands for resources in a core may be spread over time (e.g., from being spread evenly over time or occurring in synchronized bursts), according to some embodiments. Synchronized bursts may coincide when threads are collocated, possibly producing additional resource contention. Thus, it may be misleading to rely on simple average demands captured over a time, as a low average may reflect a steady demand which may be accommodated from multiple threads without penalty, or it could reflect coinciding peaks and troughs.

Thread utilization. If applications fail to scale perfectly (such as due to sequential sections, or waiting on slower threads and communication) then resource demands for threads may be reduced accordingly, according to some embodiments. Likewise, if a thread is waiting on resources (or waiting on other threads), some latency may be hidden in time lost waiting for resources. Thus, in some embodiments, a thread utilization factor f, usable to scale the requirements, may be introduced to accommodate this. A thread utilization factor may be calculated for each thread and be recomputed at each step during the model's execution, according to some embodiments.

Machine Description

According to various embodiments various pieces of information may be collected and encoded into a machine description modelling structure and/or performance of a machine. In some embodiments, machine descriptions may be created once for each machine and may be independent of the particular workload being scheduled. A machine description, such as machine description 400, may be constructed through a combination of information obtained from the operating system (OS) as well as measurements taken from performance of synthetic applications, such as stress applications 440, which may stress particular resources. For example, in one embodiment the OS may provide various types of information such as: the number of processor sockets, the number of cores per socket, and/or the number of hardware threads per core.

In some embodiments, a machine description may include information describing the structure of links between levels in the cache hierarchy, the topology of the interconnect between the sockets, and/or the locations of the links to main memory. For example, a machine description may include, and/or be represented as, a graph of the hardware components of the machine and the relationships between them. Additionally, this information may be combined with performance measurements describing bandwidth between and/or among the components. For instance, in some embodiments, a hardware description may include regarding performance of the different links in a memory system and/or performance of the cores. Thus, a machine description may include information identifying (and/or describing) multiple system components, information identifying (and/or describing) relationships between (and/or among) those components, and/or information identifying (and/or describing) performance (absolute or relative performance) along communication links and/or interconnects between the components.

Figure 5:
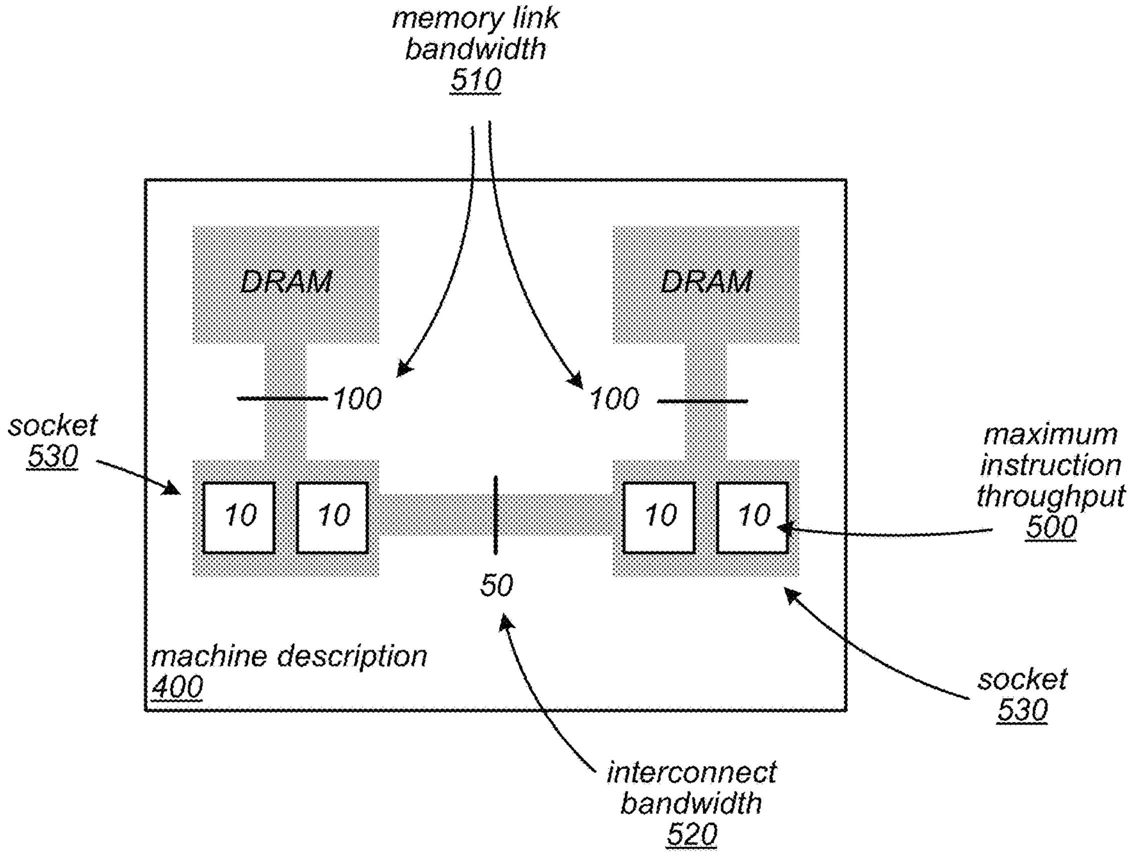
FIG. 5 is a logical block diagram illustrating an example machine model for a simple system comprising two dual-core processors and no caches, as in one embodiment.

FIG. 5 illustrates an example machine description 400 for a system comprising two dual-core processors and no caches, according to one embodiment. While FIG. 5 illustrates a machine description graphically, the information illustrated in FIG. 5 may be represented in any of various manners, according to different embodiments. A machine description 400 may indicate bandwidth 510 on the memory links (e.g., 100), bandwidth 520 on an interconnect between sockets 530, along with the maximum instruction throughput 500 per core, according to some embodiments. For instance, according to the example embodiment illustrated in FIG. 5, machine description 400 indicates memory link bandwidth of 100, an interconnect bandwidth of 50, as well as maximum instruction throughputs per core of 10. Note that for brevity units are omitted. In general, since consistent units may be used when modeling a machine and workload, the exact scale may not be relevant, according to some embodiments.

Measuring Link Bandwidth

Starting from a machine topology, one or more stress applications 440 may be executed, such as to determine the maximum bandwidth achieved on links in the memory system (e.g., between levels in the cache hierarchy or on interconnects between sockets). In some embodiments, results obtained from workloads running on the machine itself may be used for some or all of these measurements, rather than numbers obtained other sources, such as from data sheets. This empirical approach may allow the same measurement techniques to be used for profiling the machine and for profiling the performance of a workload, according to some embodiments.

In some embodiments, the implementation of the stress applications may be optimized to increase the consumption of the resource being stressed. For example, in one embodiment stress applications 440 may allocate an array of a parameterizable size accessible linearly with a single value read and/or written per cache line with accesses in an unwound loop with constant arguments to allow for effective prefetching and branch prediction. When multiple threads are used, each thread may have a unique set of cache lines that it will access. In some embodiments, the size of the array may be chosen to almost fill the size of the component at the far end of the link, without spilling into the next level. For example, according to one embodiment an array allocated in main memory may be at least 100 times the size of the last level of cache. This may ensure that most (or almost all) of the accesses miss in the cache, even if the cache is adaptively holding a portion of the array. When placing in memory, tools such as numactl, may be used to ensure the correct placement of memory allocations, according to some embodiments.

When measuring the bandwidth of shared caches, it may be important to measure the maximum bandwidth of each link to the cache and the maximum cumulative bandwidth that the cache can sustain. For example, the L3 cache may not be able to support sufficient bandwidth for the maximum access rate from a core to be sustained to all cores simultaneously. So on an 18 core chip each core may achieve a peak bandwidth of 360, but the L3 cache as a whole may only provide 5000, according to some embodiments.

Measuring Core Performance

Maximum core performance may be measured by monitoring counters (e.g., performance counters) while executing a synthetic workload. The workload may perform operations on a sufficiently small dataset such that it fits into the L1 cache without incurring cache misses during execution, according to one embodiment. In some embodiments, pipeline stalls may be avoided by providing a large number of independent operations, and branch stalls may be reduced by unwinding the loop and using constant values on the loop guard to allow good prediction. The operations may be integer based to enable peak performance. There may be variation in peak performance based on the type of operation used. Additionally, in some embodiments, two threads may be executed on the core, such as to assess if the core suffers a loss in peak performance when co-scheduling multiple software threads on different hardware thread contexts provided by the core. Performance may be measured in instructions executed per unit time.

Workload Model

As noted above, a system configured to implement Comprehensive Contention-Based Thread Allocation and Placement may collect information to model a given workload. This information may be encoded in a workload description 410. A workload description may be specific to a given workload on a given machine and may ideally be regenerated when moving to different hardware. However, predictions may remain useful across similar hardware platforms, according to some embodiments.

According to one embodiment, information about the workload's performance may be gathered by making multiple (e.g., 6 in some embodiments) test runs of the workload with different thread placements designed to elucidate particular details, such as for example, the sensitivity to having threads collocated on the same cores. Note that different factors may be inter-related, according to various embodiments.

In some embodiments, the workload model may be built up incrementally in multiple (e.g., 5) steps, with each step providing a successively more detailed description of the workload's behavior. The experimental runs may be organized so that the behavior being considered in a given step may depend (only) on factors already determined in preceding steps. For example, a step 2 may depend on step 1, while steps 3-5 may be independent of each other, but may depend on steps 1 and 2. In some embodiments, aside from a first step (e.g., step 1) these dependencies may exist only in the calculation of the model parameters—the actual experimental runs may proceed concurrently if multiple machines are available. Please note that while the various determinations and calculations described herein regarding generating a workload model represent merely one example according to one embodiment. The use of the term "step" is for ease of explanation only and is not meant to convey absolute or necessary divisions between the features described.

For example, the following table illustrates 5 example steps that may, in some embodiments, be used to generate a workload model. The following table also includes possible values for the steps for an example system illustrated in FIG. 5.

| Step | Property | Example Value |
|---|---|---|
| 1 | Single thread resource demands (d)-The single thread execution time $t_1$ and a vector of resource demands for that one thread | [7, 40] |
| 2 | Parallel fraction (p)-The fraction of the workload which runs in parallel | 0.9 |
| 3 | Inter-socket overhead ($0_s$)-the latency relative to $t_1$ for inter-socket communication when threads are placed on different sockets. | 0.1 |
| 4 | Load balancing factor (l)-The extent to which the workload can be re-balanced dynamically between threads based on their progress | 0.5 |
| 5 | Core burstiness (b)-The sensitivity to collocation of threads in a core | 0.5 |

Thread Utilization

Figure 6:
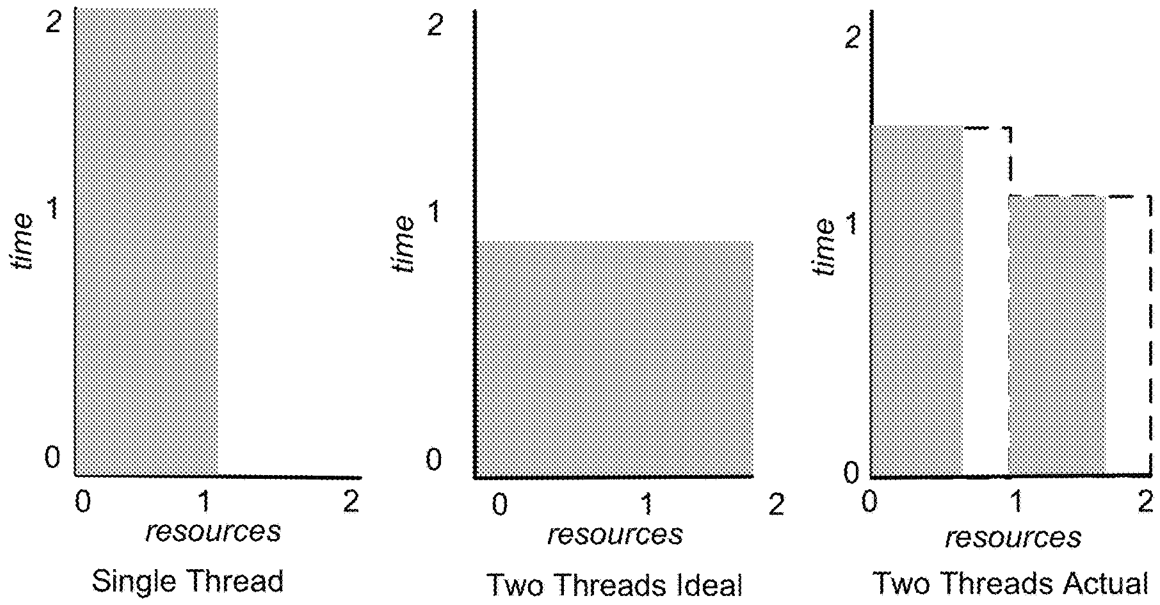
FIG. 6 illustrates examples of possible loadings when calculating thread utilization, according to some embodiments.

If applications fail to scale perfectly, such as due to sequential sections, or waiting on slower threads and communication, then their execution time may increase while the total resources they will require may remain constant. This means the rate of resource consumption for threads may be reduced accordingly. Likewise, if a thread is waiting on other threads or on resources, then some latency may be hidden in the time lost waiting for resources. As noted above, a thread utilization factor f usable to scale requirements may be introduced in some embodiments to accommodate this. This thread utilization factor may be calculated for each thread at each step based on the results of the proceeding steps. FIG. 6, discussed below demonstrates this.

FIG. 6 illustrates examples of possible loadings when calculating thread utilization, according to some embodiments. The grey boxes show the resources used in each scenario and all have the same area, and the dashed box in the third graph shows the resources available. In the first graph 1 thread is executing, in the second graph, 2 threads are executing with ideal scaling and in the third graph, 2 threads are executing with non-ideal scaling. The dashed box represents the resources available and the gray box represents the actual resources used. The utilization factor is the ratio between these two.

In the calculations described herein, according to some embodiments, the thread utilization factor is recomputed at each step. The utilization factor f may be annotated as fx to identify the value at the start of step x. Thread utilization may be necessary, in some embodiments, to remove the scaling from values when generating the workload description as well as to add it when performing performance predictions.

Figure 7:
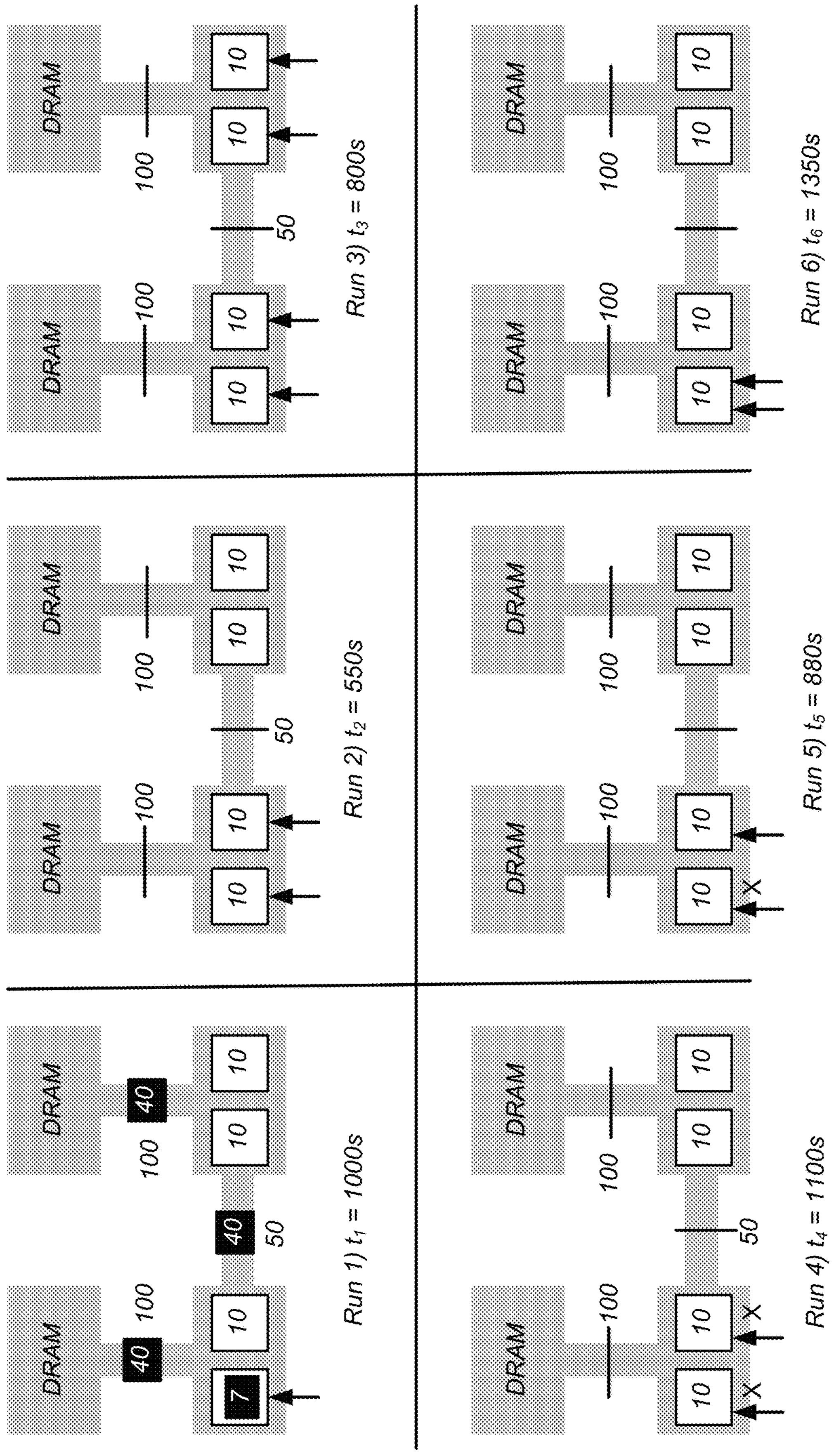
FIG. 7 is a logical block diagram illustrating 6 test workload runs used to generate a description of an example workload in one embodiment.

FIG. 7 is a logical block diagram illustrating 6 example workload test runs used, such as by workload description generator 130, to generate a description of an example workload in one embodiment. In the illustrated test runs, arrows represent threads and crosses represent stress applications. The details of the example test runs will be described in more details subsequently regarding the properties and calculations performs during test runs.

Figure 8:
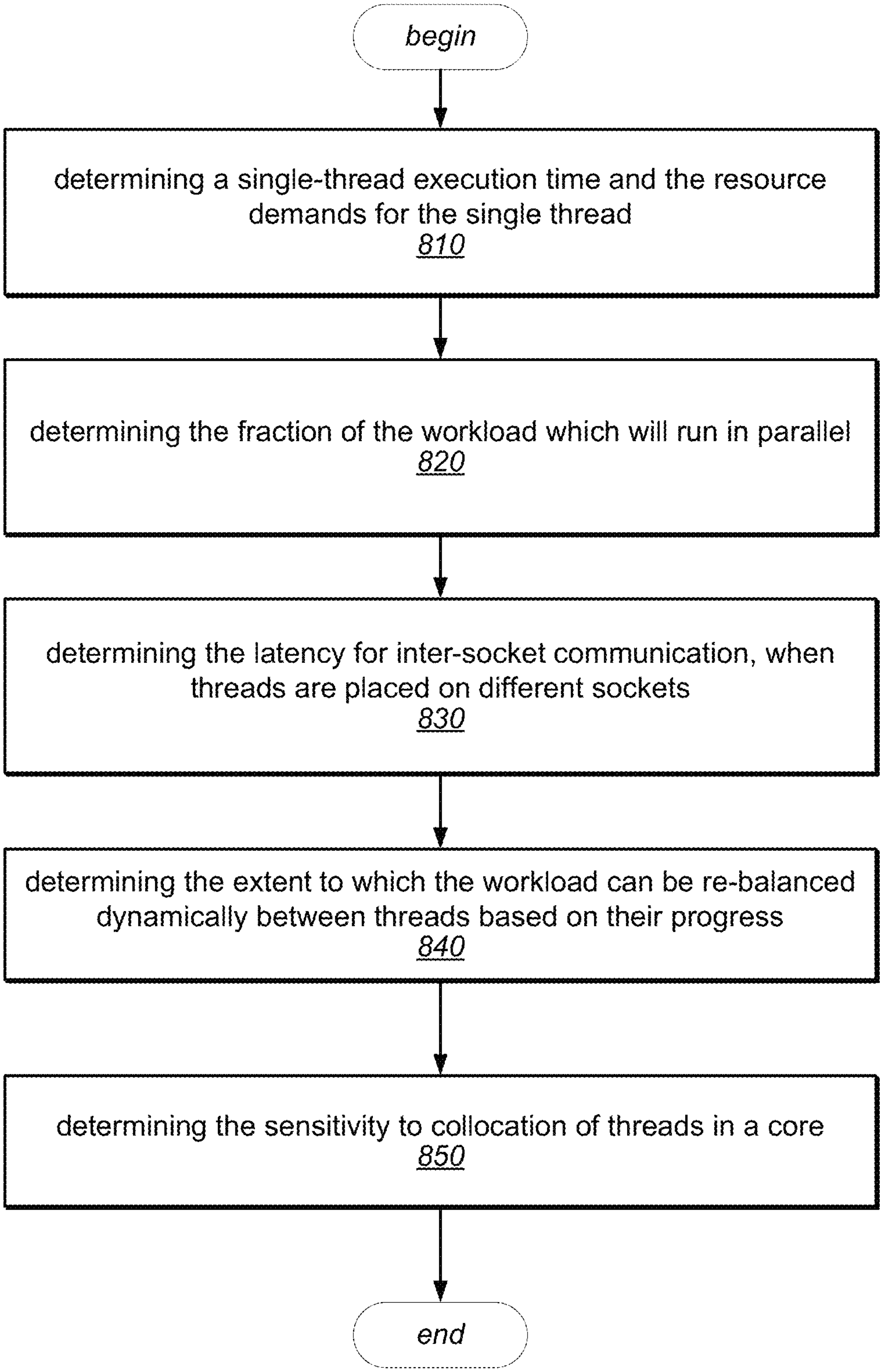
FIG. 8 is a flowchart illustrating one embodiment of a method for generating a workload description, according to one embodiment.

FIG. 8 is a flowchart illustrating one embodiment of a method for generating a workload description. As illustrated in block 810, workload description generator 130 may determine execution time and/or resource demands for a single thread. For example, the workload may be run with a single thread to obtain (e.g., calculate) an instruction execution rate and bandwidth requirements to each level of cache hierarchy as well as to main memory, as will be described in more detail subsequently.

Workload description generator 130 may also determine a fraction of the workload that may be executed in parallel, as in block 820. For instance, in one embodiment workload description generator 130 may perform an additional workload run with threads placed to avoid contention and the number of threads set sufficiently low to avoid over-subscribing resources. From timing this run, the parallel fraction may be calculated, as will be described in more detail subsequently. In some embodiments, over-subscription may be avoided based on the machine description's record of the resources available in the machine, and the single-thread resource usage determined at block 810. Threads may be placed on each core in turn such that the total load on the machine remains below resource availability.

Workload description generator 130 may further determine the latency (or may determine a value indicating the latency) for inter-socket communications when threads are placed on different sockets, as in block 830. For example, in some embodiments inter-socket latency may be defined as the additional time penalty a given thread incurs for each of the threads on a different socket (e.g., different to the given thread). To determine inter-socket latency workload description generator 130 may, in some embodiments, perform another workload run using the same placement as that used for determining the parallel fraction, but moving a portion (e.g., half) of the threads onto the other socket. The inter-socket latency may then be determined based on results of this additional workload run, as will be described in more detail subsequently.

Workload description generator 130 may also determine an extent to which the workload may be re-balanced between threads based on their progress, as in block 840. For example, to determine a load-balancing factor, workload description generator 130 may deliberately slow down threads and observe how the workload's execution changes, as will be described in more detail subsequently.

Workload description generator 130 may further determine the sensitivity to collocation of threads within a core, as in block 850. For example, workload description generator 130 may compare the performance of two workload runs that differ only in the collocation of threads on cores. Core burstiness, or the percentage extra time required due to collocation may be calculated, as will be described in more detail subsequently. While the various steps illustrated in FIG. 8 are shown in particular order, they may be performed in different orders according to various embodiments.

Single Thread Time and Resource Demands (Step 1)

First, the workload may be run with a single thread to get the time t1 along with the instruction execution rate and the bandwidth requirements for a single thread between each level of the cache hierarchy and between the last level cache and the main memory. These metrics may provide the basic sequential resource demands of the workload. They may be measured using the same performance counters described above during a single run. Since, there is only 1 thread, scaling due to the results from other steps described below may not be required for this step. Run 1 of FIG. 7 shows an example of the results collected according to an example embodiment.

In each subsequent step the execution time recorded at step x ($t_x$) may be normalized relative to this sequential execution time $r_x=t_x/t_1$ and this relative time $r_x$ may be the product of the known factors ($k_x$) already accounted for in previous steps, and the unknown factors ($u_x$) which are not yet determined. In some embodiments $k_x$ may be calculated based on the workload description from the existing steps. $u_x$ may then be calculated by $u_x=r_x/k_x$ Parallel Fraction (Step 2)

The parallel fraction (e.g., an expected workload scaling in the absence of other constraints) may be determined with an extra run, as illustrated in FIG. 7 (Run 2). This thread placement may use only 1 thread per core, and may constrain those threads to a single socket. This may, in some embodiments, avoid dependencies on any other as-yet-uncalculated parts of the workload model. The placement may also be constrained to avoid over-subscription so that information from subsequent modelling steps does not need to be incorporated, thereby ensuring only 1 valid value of p. In practice choosing such a placement may not represent a problem on any of the hardware looked at so far as the existing constants may mean it is only required to not overload the cumulative L3 cache bandwidth and the main memory bandwidth. In some embodiments, when selecting this placement, the largest number of threads that can be placed on a single socket while still satisfying the above conditions may be used and the placement may be made to use an even number of threads so that the result may be reused. p may then be derived from Amdahl's law with the equation:

$$u_2 = 1 - p + \frac{P}{n}$$

Inter-Socket Latency (Step 3)

Following the workload assumptions, each thread may be assumed to communicate equally with every other thread, according to some embodiments. Each of the links between threads may incur a latency ($o_s$) if it crosses an inter-socket boundary. Thread placement may be chosen to measure this maintains symmetry for all thread communication, as in run 3 of FIG. 7.

Adding the $$\frac{n}{2}$$

links in this placement that incur the latency $o_s$ to the parallel fraction model results in:

$$r_3 = \left(1 + \frac{\frac{n}{2} \times o_s}{f_{comm}}\right)\left(1 - p + \frac{p}{n}\right),$$

according to this example embodiment.

The links $o_s$ may be scaled by $f_{comm}$ as described above regarding thread utilization. Removing the known factors this becomes:

$$u_3 = 1 + \frac{\frac{n}{2} \times o_s}{f_{comm}}$$

from which $o_s$ may be solved according to this example embodiment.

Load Balancing Factor (Step 4)

The profiling runs for steps 1-3 may use symmetric placements (e.g., in the sense that each thread may experience the same (or similar) contention as other threads. For instance, in some embodiments using symmetric placements may involve having the same number of threads per core and the same number of threads per socket across all cores and sockets hosting threads. However, in some embodiments, the workload description may be extended to describe cases where threads are not placed symmetrically. In these cases, it may be important to determine the effect on the overall speed of a workload if some threads slow down more than others. For instance, some workloads may use static work distribution, and a slow thread may become a straggler, possibly delaying completion of workload. Other workloads may use work stealing to distribute work dynamically between threads, thereby possibly allowing any slowness by one thread to be compensated for by other threads picking up its work, so performance may be the aggregate throughput.

In some embodiments, this may be expressed by using a load balancing factor $l \in [0 \ldots 1]$ indicating where a workload lies between these extremes. If l=0 then there is no dynamic load balancing, and the threads proceed in lock-step. If l=1 then they may proceed independently, according to some embodiments. In practice, workloads may be somewhere between these points. The load balancing factor l may be measured by considering how the performance of one thread impacts the performance of the complete workload. To do this, in some embodiments, threads may be deliberately slowed down and how the workload's execution changes may be observed. In a given run, $s_i$ may be considered the slowdown of thread i, and $$s_{min} = \min_{i=1}^{i=n} si.$$

If there are n threads, and a parallel fraction p, then the relative execution rate in the two extreme cases is:

Lock-Step:

$$s_{lock} = \left((1-p) \times s_{min} + p \times \max_{i=1}^{i=n} s_i\right)$$

Load-Balanced:

$$s_{bal} = \left((1-p) \times s_{min} + np / \left(\sum_{i=1}^{n} \frac{1}{s_i}\right)\right)$$

For a run in between these extremes the relative execution rate ($s_l$) is:

$$s_l = (1-l) \times s_{lock} + l \times s_{bal}$$

In some embodiments, l may be calculated from multiple (e.g., 3) runs, with all runs possibly using the same thread layout, as in FIG. 7 (Runs 2, 4, & 5). In run 2 the threads may execute as normal, so for all i, $s_i=1$. In run 4 all threads may compete against a simple CPU-bound loop which will delay their execution. The ratio between these relative times gives $u_4/u_2=s_{stresser}>1$. Using this value values for $s_{lock}$ and $s_{bal}$ may be constructed for the case where n−1 threads have $s_i=1$ and 1 thread has $s_i=s_{stresser}$. In run 5 only one thread may be slowed. The slowdown experienced is $u_5/u_2=S_l$ allowing the above equation to be solved for 1.

Core Burstiness (Step 5)

To account for core burstiness the performance of two runs may be compared which differ only in the collocation of multiple threads per core, FIG. 7 (Runs 2, & 6). The first run may use one thread per core across a single socket, while the second run may use the same number of threads packed into half the number of cores, according to one example embodiment.

Taking the unknown factors remaining in these two runs burstiness may be defined as the percentage extra time required due to collocation:

$$\text{Burstiness: } b = \frac{1}{f_b} \times \left(\frac{u_6}{u_2} - 1\right)$$

In the above burstiness equation, $$\frac{1}{f_b}$$

is used since there is no scaling (i.e., $u_2=1$) in this example embodiment. However, in other embodiments, scaling may need to be included (e.g., from whichever run replaces $u_2$), replacing $$\frac{1}{f_b}$$

with the scaling factor divided by $f_b$.

Performance Prediction

Given a machine description, workload description and a proposed thread placement, the performance for the proposed thread placement may be predicted. The performance may be constructed from two elements: (i) an anticipated speed-up based on Amdahl's law assuming perfect scaling of the parallel section of the workload, and (ii) a slowdown reflecting the impact of resource contention and synchronization, according to some embodiments.

Speedup. As discussed above a speedup may be calculated (e.g., via Amdahl's law) based on the parallel fraction of the workload (p) and the number of threads in use (n). For example, using an example workload described above (p=0.9) and using the placement in FIG. 9, n=3 so speedup=2.5.

Slowdown. The slowdown may then be predicted by considering the resource-contention, communication, and synchronization introduced by the threads. These factors may be considered interdependent. In some embodiments, these different factors may be handled by proceeding iteratively until a stable prediction is reached (in practice only a few iteration steps are needed for the workloads we have studied).

Figure 9:
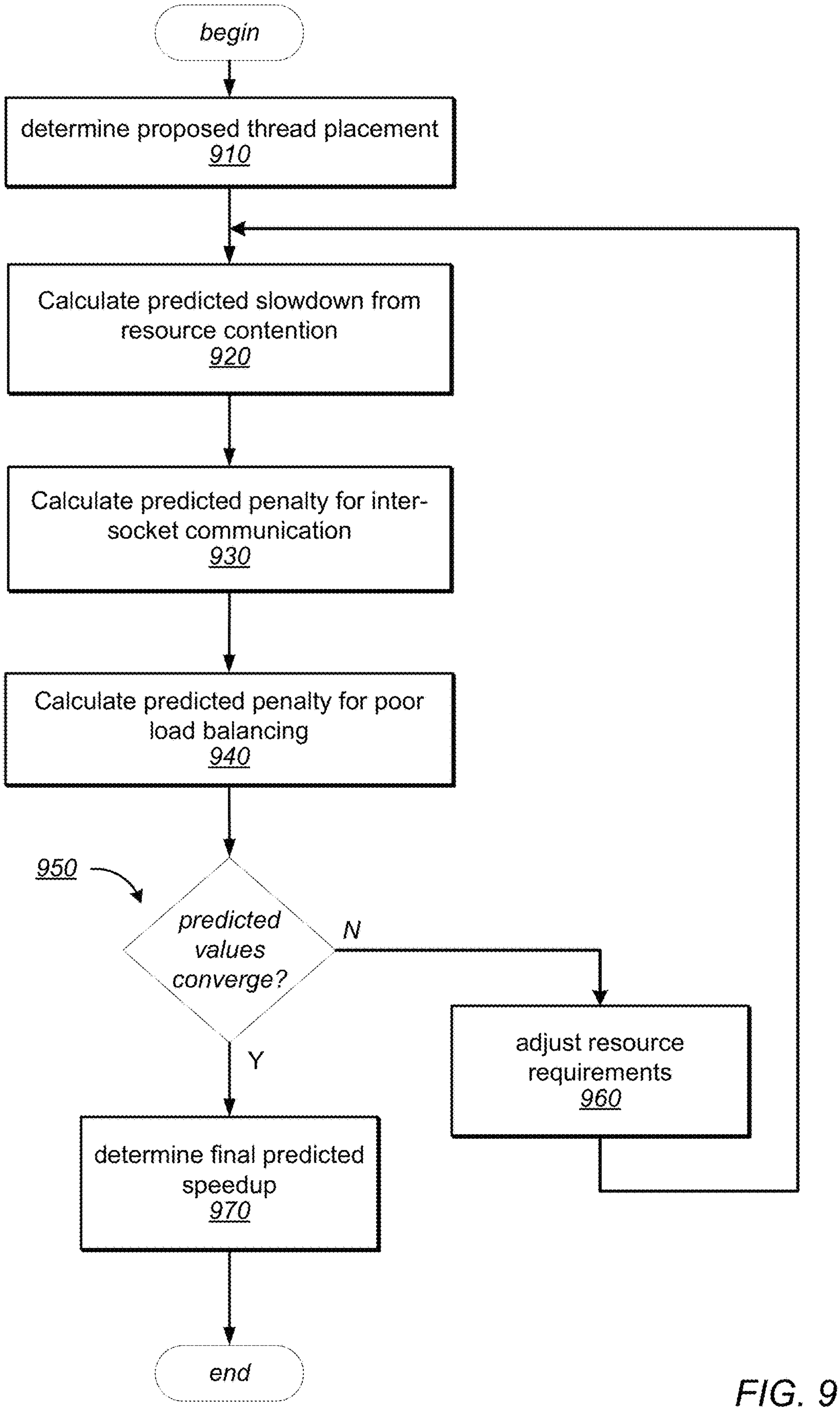
FIG. 9 is a flow chart illustrating one embodiment of a method for performance prediction using three example threads.

FIG. 9 is a flow chart illustrating one embodiment of a method for performance prediction, for three threads U, V, W, running the workload from FIG. 7. First, a proposed thread placement may be determined, as in block 910. Then a predicted slowdown may be calculated from resource as in block 920. For instance, in one embodiment a naive set of resource demands based on the per-thread resource usage may be combined with the machine model based on the locations of the threads and used to model contention for hardware resources.

Additionally, as in block 930, a predicted penalty for inter-socket communication may be calculated. For example, to predict the performance impact of inter-socket communication, the system may consider the locations of the threads being modeled and the amount of work that will be performed by each thread. An overhead value representing additional latency may be determined as the latency incurred by a given thread when communicating with another thread. Additionally, the slowdown incurred by the placement of threads on different sockets as well as the prevalence of lockstep execution between threads may both be accounted for.

The predicted penalty for poor load balancing may also be calculated as in block 940. For example, in some embodiments, the workload's load balancing factor may be used to interpolate between the extreme case and the workload's current predicted slowdown.

As illustrated by the negative output of decision block 950, if the per-thread predictions have not converged, the results from the communication and synchronization phased (described above regarding blocks 920, 930 and 940) may be feed back into the contention phases. For example, each time around the loop in FIG. 9, new values may be calculated for the contention-based slowdown which may be used to estimate the costs of communication and synchronization, which in turn may be fed back into the next iteration. Additionally, as in block 960, the resource requirements may be adjusted each time through the loop, such as to allow for slowdowns from interconnect as one example, as will be described in more detail below regarding iterating. After the per-thread predictions have converged, as indicated by the positive output of decision block 950, the final predicted speedup may be calculated, as in block 970. For example, in some embodiments, the final predicted speedup may be calculated by combining the speedup from Amdahl's law with the average slowdown predicted for the threads.

Thus, for each thread, there may be maintained (i) an overall predicted slowdown, and (ii) the thread utilization factor (fd) used to scale resources to the time the thread is working. Initially, a factor of the Amdahl's law speedup divided by the ideal speedup may be used. Additionally, alternating between (i) modeling the contention for hardware resources occurring as the threads execute, and (ii) Adding or removing slowdown attributed to communication and synchronization may also be used, in some embodiments.

The following table illustrates, according to one example, the start of the first iteration:

| Thread | U | V | W |
|---|---|---|---|
| Resource slowdown + | 1.00 | 1.00 | 1.00 |
| communication penalty + | 0.00 | 0.00 | 0.00 |
| load balance penalty | 0.00 | 0.00 | 0.00 |
| Overall slowdown | 1.00 | 1.00 | 1.00 |
| New thread utilization | 0.83 | 0.83 | 0.83 |

In some embodiments, the thread utilization factors may be initialized as the Amdahl's law speedup divided by the ideal speedup, the number of threads. This reflects the fraction of the time that a thread would be busy if the Amdahl's law speedup is achieved. For instance, if n=3, and the Amdahl's law speedup is 2.5, then the threads will be busy in parallel work for 0.83 of their time. This first estimate may be referred to herein as $f_{initial}$. Note that the same value may be used across all threads rather than distinguishing a main thread which executes sequential sections. This may reflect an assumption of generally-parallel workloads in which sequential work is scattered across all threads in critical sections.

Slowdown from Resource Contention

Figure 10:
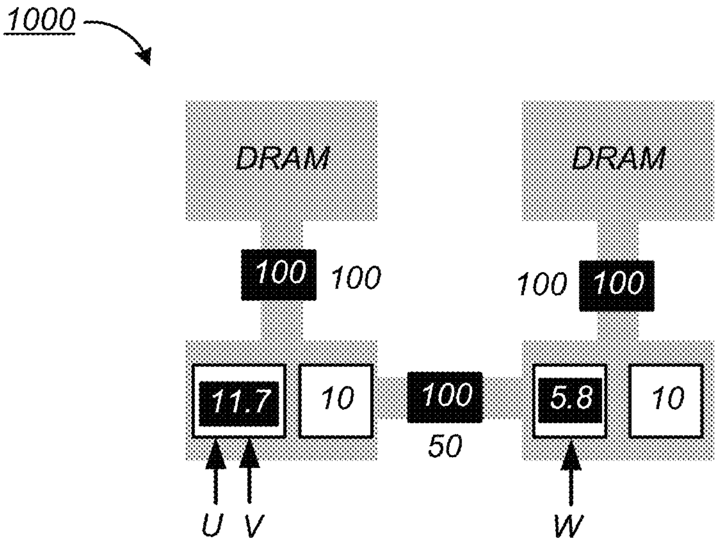
FIG. 10 is a logical block diagram illustrating an example machine model using initial resource demand values for three threads, according to one embodiment.

In some embodiments, contention for hardware resources may be modeled by starting from a naïve set of resource demands based on the vector d in the workload description. For instance, the values in the vector may represent rates and therefore may be added at each of the locations running a thread from the workload. These values may be scaled by the respective thread utilization factors. Thus, for each resource, contributions of the individual threads may be summed and the aggregate rate demanded may be shown. For example, while the aggregate required bandwidth to DRAM is 3×40=120, it is scaled 0.83×120=100, as illustrated by the example machine description 1000 in FIG. 10.

Based on the resource demands, the overall predicted slowdowns for each thread may be initialized. The vector may be initialized to the maximum factor by which any resource used by the thread is over-subscribed. In the example, this is the interconnect link between the two sockets which is oversubscribed by a factor of $$\frac{100}{50} = 2.$$

In more complex examples, according to different embodiments, different threads may see different bottlenecks.

This basic model of contention may be applied for all of the resources in the machine. However, in addition, the workload model's core burstiness factor (b) may be incorporated in cases where threads share a core. The following table illustrates example slowdowns updated based on the most over-subscribed resource used by each thread and to reflect the fact that U and V share a core:

| Thread | U | V | W |
|---|---|---|---|
| Resource slowdown + | 2.83 | 2.83 | 2.00 |
| communication penalty + | 0.00 | 0.00 | 0.00 |
| load balance penalty | 0.00 | 0.00 | 0.00 |
| Overall slowdown | 2.83 | 2.83 | 2.00 |
| New thread utilization | 0.29 | 0.29 | 0.42 |

Threads U and V may be slowed by b' in this example workload model because they share a core, whereas W is not. b' is the scaled value of b, and is calculated by:

$$b'=1+b\times f_b f_b=0.83$$

As described above, this may reflect the fact that some workloads show significant interference between threads on the same core even though the average resource demands for functional units are well within the limits supported by the hardware, according to various embodiments. The thread utilization factors may then be recomputed reflected these new slowdowns. For instance, while initially calculated by the Amhahl's law speed up divided by the ideal speed up, the slowdown may now be included, such as by dividing the Amdahl's law speedup by the expected slowdown. This in this example, (2.5/2.83)/3=0.29 and (2.5/2)/3=0.42.

Penalties for Off-Socket Communication

The overheads introduced by synchronization between threads may also be accounted for. For example, there may be two factors to consider. First, the slowdown incurred by the placement of threads on different sockets, leading to increased latency in their use of shared-memory data structures for communication. Second, prevalence of lockstep execution between threads, requiring threads performing at different rates to wait for one another.

Quantitatively, the overhead value $o_s$ may represent the additional latency for each pair of threads that is split between different sockets, such as under the assumption that the work performed is distributed evenly between the threads (as it is in the profiling runs). To predict the performance impact of communication, the system may consider (i) the locations of the threads being modeled, and hence the number of pairs which span sockets, and (ii) the amount of work that will be performed by each thread, and hence how significant or not a given link will be. In some embodiments, $o_{i,j}$ may be defined to be the latency incurred by thread i for communication between threads i and j—this is equal to $o_s$ if the threads are on different sockets and 0 otherwise.

To model the amount of work performed by each thread the load balancing factor may be considered. For example, if the threads proceed in lockstep then the amount of work they perform may be equal, whereas if they are completely independent then faster threads may perform more of the work. The communication in these two extreme cases may be considered and interpolated linearly between them based on the load balancing factor l.

Completely lock-step execution. When execution proceeds without any dynamic load balancing, each of the threads may perform an equal amount of work so additional slowdown for communication for thread i is:

$$\text{lockstep }(i) = \sum_{j-1}^{j=n} o_{i,j}$$

In the example:

$$\text{lockstep}(U)=\text{lockstep}(V)=0.0+0.0+0.1$$

$$\text{lockstep}(W)=0.1+0.1+0.0$$

Completely independent execution. When execution is completely independent, the amount of work performed by the threads may differ. The busier threads may communicate more, and their links with other threads may be more significant. Given the current predicted slowdowns for each thread $s_1 \ldots s_n$, the weight $w_i$ of a thread may be defined as the fraction of the total work that thread i will perform:

$$\text{work}_i = \frac{1}{s_i} \quad w_i = \frac{\text{work}_i}{\sum_{j=1}^{j=n} \text{work}_j}$$

In the example, given slowdowns 3, 3 and 2 for the three threads, we have weights $$\frac{2}{7}, \frac{2}{7} \text{ and } \frac{3}{7}$$

respectively. The fastest thread may perform more of the work than the slower threads, and the communication it performs is likely to be more significant. For instance, in a system with caches, it may be stealing cache lines from the other threads more frequently.

Given these weights the communication cost is then:

$$\text{independent }(i) = n\sum_{j-1}^{j=n} w_j o_{i,j}$$

In the example:

$$\begin{aligned}\text{independent }(U) &= \text{independent}(V)\\ &= (0.88\times0.0+0.88\times0.0+1.24\times0.1)\\ &= 0.124\\ \text{independent}(W) &= (0.88\times0.1+0.88\times0.1+1.24\times0.0)\\ &= 0.176\end{aligned}$$

Combining the results. Given the two extreme cases, we may interpolate linearly between them based on the load balancing factor to obtain an additional slowdown factor:

$$\text{comm.slowdown}(i)=l\ \text{independent}(i)+(1-l)\text{lockstep}(i)$$

In the example:

$$\begin{aligned}comm.\ slowdown(U) &= comm.\ slowdown(V)\\ &= 0.5\times0.1+0.5\times0.124\\ &= 0\times112\\ comm.\ slowdown(W) &= 0.5\times0.2+0.5\times0.176\\ &= 0.188\end{aligned}$$

Each of these may then be scaled by $f_l$ (0.29, 0.29 & 0.42), such as to allow for the extra time available for communication if the other operations are slowed down by other conflicts. These may then be added to the existing slowdowns for each of the threads.

Penalties for Poor Load Balancing

Additionally, whether or not the workload can dynamically rebalance work between the threads may be accounted for. In one extreme case, if the threads proceed completely in lock-step, then they may have to wait for one another to complete work and so the overall performance may be governed by the slowest thread. In the example, thread W would be slowed down to match U and V if they operated completely in lockstep, and all three threads would have slowdown 2.88.

In some embodiments, the workload's load balancing factor l may be used to interpolate between the extreme case and the workload's current predicted slowdown. The following two tables illustrate, according to this example embodiment, where l=0.5, W being slowed down to the point 50% of the way between 2.08 and 2.87:

The following table illustrates example slowdowns updated to include predicted cross-socket communication where U and V communicate with lower overhead than U and W:

| Thread | U | V | W |
|---|---|---|---|
| Resource slowdown + | 2.83 | 2.83 | 2.00 |
| communication penalty + | 0.03 | 0.03 | 0.08 |
| load balance penalty | 0.00 | 0.00 | 0.00 |
| Overall slowdown | 2.87 | 2.87 | 2.08 |
| New thread utilization | 0.29 | 0.29 | 0.40 |

The following table illustrates how, after the first iteration, slowdowns updated to include the effect of dynamic load balancing between the threads:

| Thread | U | V | W |
|---|---|---|---|
| Resource slowdown + | 2.83 | 2.83 | 2.00 |
| communication penalty + | 0.03 | 0.03 | 0.08 |
| load balance penalty | 0.00 | 0.00 | 0.40 |
| Overall slowdown | 2.87 | 2.87 | 2.48 |
| New thread utilization | 0.29 | 0.29 | 0.34 |

Iterating

In some embodiments, the system may alternate between updating the slowdown estimates based on resource contention and updating the estimates for the impact of communication and synchronization. Each time around the loop in FIG. 9, new values may be calculated for the contention-based slowdown, then these may be used to estimate the costs of communication and synchronization, which in turn may be fed back into the next iteration. In some embodiments, only a few iteration steps may be needed for the workloads.

For example, information may be fed from iteration i to i+1 by updating the thread utilization factors used as the starting point for i+1. For each thread, the system may determine the amount of overall slowdown in iteration i that was due to the penalties incurred. In some embodiments, this may be the ratio of the thread's slowdown due to resource contention to its overall slowdown. In the ongoing example, threads U and V have 2.83/2.87=0.99, and thread W has 2.0/2.48=0.81. This difference may reflect the fact that thread W is harmed by poor load balancing. The new iteration (i+1) may be started by resetting the thread utilization factors to $f_{initial}$ scaled by the penalties. This may be considered as transferring the lessons learned about synchronization behavior in iterations 1 . . . i into the starting point for iteration i+1.

To feed results from the communication and synchronization phase back into the contention phase the system may, in some embodiments, calculate new thread usage factors, such as to reflect any changes to the performance limitations of each thread from synchronization or communications delays. Following the ongoing example, the thread utilizations for thread U and V are updated to $f_{initial}$*0.99=0.83*0.99=0.82, and W is updated to 0.83*0.81=0.67, as in the following table, which illustrates the state at the start of the second iteration:

| Thread | U | V | W |
|---|---|---|---|
| Resource slowdown + | 1.00 | 1.00 | 1.00 |
| communication penalty + | 0.00 | 0.00 | 0.00 |
| load balance penalty | 0.00 | 0.00 | 0.00 |
| Overall slowdown | 1.00 | 1.00 | 1.00 |
| New thread utilization | 0.82 | 0.82 | 0.67 |

Figure 11:
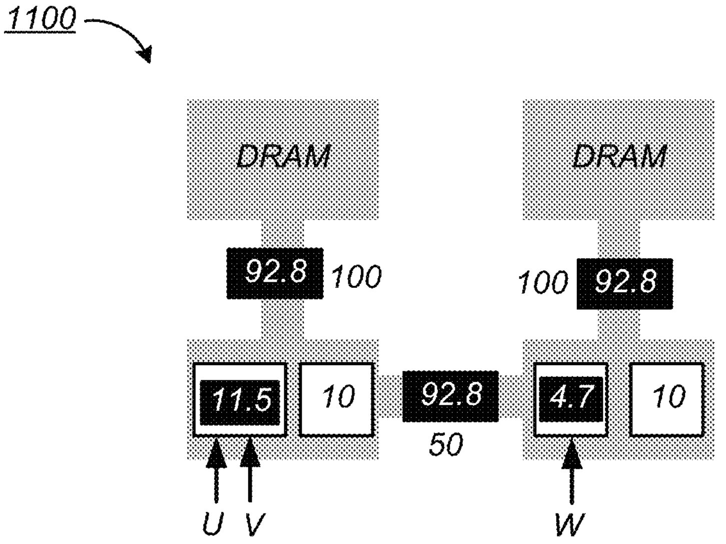
FIG. 11 is a logical block diagram illustrating an example machine model using resource demand values for three threads at the start of a second iteration, according to one embodiment.

Thus, in the ongoing example, the new thread utilization factors are 0.82 for U and V, and 0.67 for W. The other parts of the prediction are reset and the system may continue by computing the new resource demands based on the new thread utilization factors, as illustrated for the example model 1100 in FIG. 11. Comparing the resource demands illustrated in FIG. 10 with those in FIG. 11, the load imposed by thread W is reduced (e.g., significantly), but the interconnect remains the bottleneck.

Final Predictions

After the per-thread predictions have converged, the final predicted speedup may be calculated, such as by combining the speedup from Amdahl's law with the average slowdown predicted for the threads using our model:

$$\text{speedup} = \text{Amdahl's law speedup} \times \frac{\sum_{i=1}^{n} \frac{1}{s_i}}{n}$$

In the example, this gives a predicted speedup of 1.005 after 4 iterations. This extremely poor performance may be considered as primarily due to the inter-socket link being almost completely saturated by a single thread.

Evaluation

Comprehensive Contention-Based Thread Allocation and Placement, as described herein, may be implemented for various types of machines, according to various embodiments. For instance, in some embodiments, Comprehensive Contention-Based Thread Allocation and Placement may be implemented for cache-coherent shared-memory multi-processor machines. The performance of Comprehensive Contention-Based Thread Allocation and Placement, as described herein was tested on 22 test benchmark workloads. The evaluation described herein was carried out using, according to one example embodiment, 2-socket Intel Haswell systems with 18 cores per socket (72 total hardware threads) in which parallelism is exposed by multiple threads within each core, multiple cores within each chip, and two chips within the complete machine.

For each benchmark the 6 runs required to generate the workload model were performed. When performing the example evaluation described herein, it may be assumed that the hardware is homogeneous in that each core is identical, each chip is identical, and the interconnect between the sockets is the same from the viewpoint of each chip.

However, other systems, such as systems that may be considered typical of machines used in current data centers, both for scale-out workloads using multiple 1-socket and 2-socket systems, and for scale-up workloads using large multiprocessor machines, may be utilized in different embodiments.

Comprehensive Contention-Based Thread Allocation and Placement is described herein mainly in terms of stand-alone benchmarks, but the techniques described herein may also be applicable for use within other systems, such as within a server application for coordinating the allocation of resources to different concurrent queries, according to various embodiments. The following assumptions may be made about these workloads:

- Programs comprising parallel sections executed with a configurable number of threads and plentiful work to distribute between/among the threads.
- Homogeneous behavior between the threads in a parallel region—e.g., if executing loop iterations in parallel, there are similar resource demands for each iteration.
- Low algorithmic cost of adding extra threads—e.g., introducing additional parallel threads does not significantly extend sequential work between parallel regions.
- Workload determined primarily based on the use of resources being modeled, such as the rate at which CPU cores execute instructions, the bandwidths achieved on communication within the memory system, and/or bandwidth use on external networks, according to various embodiments.

The properties described above may cover many analytics workloads where the degree of parallelism is configurable, and execution proceeds by iterating over shared-memory data structures such as graph vertices or database columns. In the evaluation described herein a range of in-memory database join operators, a graph analytics workload, and existing parallel computing benchmarks using OpenMP are used, according to various embodiments.

To evaluate the accuracy of the predictions made with these descriptions, 72,448 timed runs were performed covering approximately 20% of the possible placements of each workload, with a performance prediction generated for each placement.

For most workloads, the measured and predicted results are visually close. Any error in these predictions may be qualified using two metrics:

- Error: The first is the difference between the two predictions as a percentage of the measured value. The absolute value of the difference from each prediction is used to construct the mean and median values.
- Offset Error: In the second metric the mean difference between the two sets of values is added to the predicted line before measuring the differences in the resulting output. This technique may remove errors introduced when the two datasets are some constant value apart, thereby possibly providing a better measure of how accurate the output is at predicting performance trends if not exact values.

According to the example evaluation, the median error across the runs is 8% and the median offset error is 4%.

To assess portability of the techniques described herein, the experiments where repeated on a two socket Intel Sandy Bridge machine with 8 cores per socket, providing 32 hardware threads in total, according to one example evaluation embodiment. The smaller number of core in this example allowed all placements to be tested exhaustively.

To test the portability of the workload descriptions between different machines the Haswell workload descriptions with the Sandy Bridge machine description were used to generate predictions for the Haswell machine, and the Haswell workload descriptions to generate results for the Haswell Machine. The resulting errors for these show that while the relative error increases, the results are still useful, according to the example evaluation embodiments.

Power management. Modern processors may use sophisticated dynamic power management techniques. These techniques may include features such as the Turbo Boost technology in Intel processors which allows cores to run faster when only a small number of them are active, and dynamic adaptation between different frequency-voltage operating points (Pstates) depending on processor temperature.

It may be considered common to attempt to disable these features. However, doing so may be unrealistic for several reasons. First, these features are generally enabled by default and used in production settings. Second, the performance with Turbo Boost disabled may be considered strictly worse than with it enabled—that is, we see a performance cost disabling this features even when all threads are active and no boost is naively expected. The approach described herein according to one embodiment, may leave all hardware power management features enabled, but may remove these effects from measurements by filling any otherwise-idle cores during profiling with a core-local workload.

Extensions. The techniques described herein may be considered to have two principle limitations: Multiple thread types; and Discontinuous scaling.

Multiple thread types. Many applications may consist of multiple thread types, the most common of these is a master thread and n−1 slave threads, but there are other applications with more complex separation of threads. In some embodiments, is may be assumed that all threads have similar behavior. More heterogeneous workloads may be considered in some embodiments, such as by identifying groups of threads. For example, in one embodiment, separate groups of threads may be identified from the data collected from the machine counters using techniques such as Principle Component Analysis (PCA) it may be possible to use techniques such as Principle Component Analysis (PCA). In other embodiments, thread groupings may be exposed explicitly from the runtime system. The techniques described herein may construct the elements of the job description that differ from thread to thread, thereby allowing the modelling of this more complex environment, according to some embodiments.

CONCLUSION

Described herein are techniques for implementing a tool able to measure hardware and workloads in order to construct a model from 6 runs that predicts the performance and resource demands of the workload with different thread placements on the hardware, according to some embodiments. Testing this on a set of 22 workloads across many thousands of placements has shown a high degree of accuracy from most workloads, according to some embodiments. This means that the results may be used to make real decisions about the placements of workloads. As the measurements made by the techniques described herein may be comparable between workloads, they may be extended the collocation of multiple workloads.

The model may be built around measuring the CPU and bandwidth resource demands, coupled with measurements of the interactions between threads, according to some embodiments. The simple bandwidth-based level of detail may be considered effective for the workloads describe herein. This may be considered in contrast to much prior work which has generally focused on more detailed models of how workloads interact through competition for shared caches. The trend appears to be that while individual cache architectures are possibly becoming more complex, the necessity to model them in detail is possibly being diminished. One reason for this difference may be that hardware may now be more effective in avoiding pathologically bad behavior. This kind of technique may make workloads less susceptible to “performance cliffs’.

In some embodiments, the techniques described herein may be operated at the level of rack-scale clusters. The number of possible placements of threads on even a single 36 cores node with hyper-threading may exceed $1.5\times10^{18}$, and even with symmetry taken into account there may still be 18144 possible thread placements. The techniques as described herein were discussed in referenced to applications running on a single cluster node, such as to allow for the generation of a set of job placements to compare the model against that covers approximately 20% of the possible placements, according to various example embodiments.

Example Computing System

Figure 12:
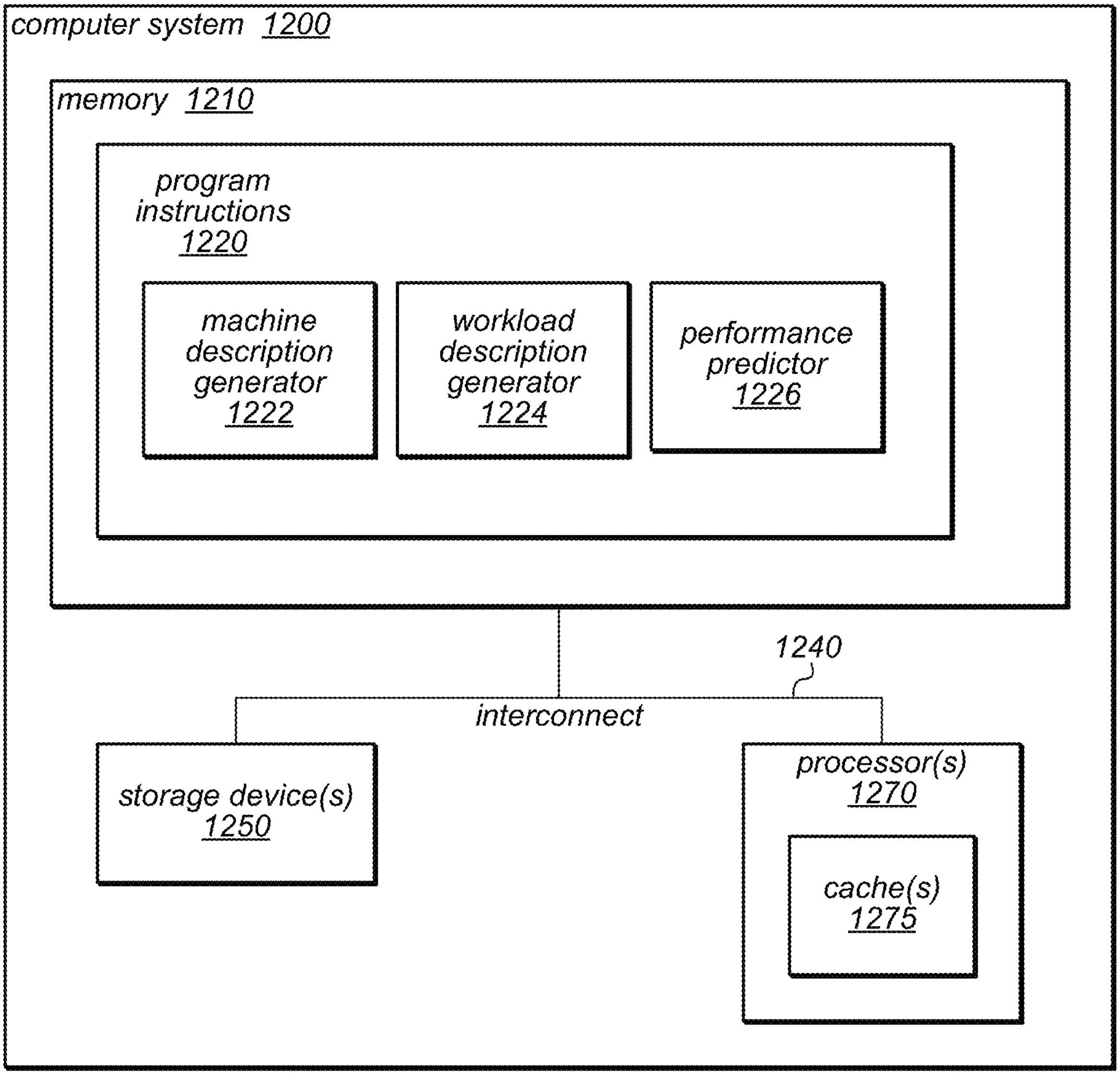
FIG. 12 is a logical block diagram illustrating one embodiment of a computing system that is configured to implement the methods, mechanisms and/or techniques described herein.

The techniques and methods described herein for Comprehensive Contention-Based Thread Allocation and Placement may be implemented on or by any of a variety of computing systems, in different embodiments. For example, FIG. 12 is a block diagram illustrating one embodiment of a computing system that is configured to implement such techniques and methods, as described herein, according to various embodiments. The computer system 1200 may be any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc., or in general any type of computing device.

Some of the mechanisms for Comprehensive Contention-Based Thread Allocation and Placement, as described herein, may be provided as a computer program product, or software, that may include a non-transitory, computer-readable storage medium having stored thereon instructions, which may be used to program a computer system 1200 (or other electronic devices) to perform a process according to various embodiments. A computer-readable storage medium may include any mechanism for storing information in a form (e.g., software, processing application) readable by a machine (e.g., a computer). The machine-readable storage medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; electrical, or other types of medium suitable for storing program instructions. In addition, program instructions may be communicated using optical, acoustical or other form of propagated signal (e.g., carrier waves, infrared signals, digital signals, etc.)

In various embodiments, computer system 1200 may include one or more processors 1270; each may include multiple cores, any of which may be single- or multi-threaded. For example, multiple processor cores may be included in a single processor chip (e.g., a single processor 1270), and multiple processor chips may be included in computer system 1200. Each of the processors 1270 may include a cache or a hierarchy of caches 1275, in various embodiments. For example, each processor chip 1270 may include multiple L1 caches (e.g., one per processor core) and one or more other caches (which may be shared by the processor cores on a single processor). The computer system 1200 may also include one or more storage devices 1250 (e.g. optical storage, magnetic storage, hard drive, tape drive, solid state memory, etc.) and one or more system memories 1210 (e.g., one or more of cache, SRAM, DRAM, RDRAM, EDO RAM, DDR RAM, SDRAM, Rambus RAM, EEPROM, etc.). In some embodiments, one or more of the storage device(s) 1250 may be implemented as a module on a memory bus (e.g., on interconnect 1240) that is similar in form and/or function to a single in-line memory module (SIMM) or to a dual in-line memory module (DIMM). Various embodiments may include fewer or additional components not illustrated in FIG. 12 (e.g., video cards, audio cards, additional network interfaces, peripheral devices, a network interface such as an ATM interface, an Ethernet interface, a Frame Relay interface, etc.)

The one or more processors 1270, the storage device(s) 1250, and the system memory 1210 may be coupled to the system interconnect 1240. One or more of the system memories 1210 may contain program instructions 1220.

Program instructions 1220 may be executable to implement machine description generator 120, or workload description generator 130, and/or performance predictor 140. In various embodiments, machine description generator 120 may be same as, or may represent, workload description generator 130 and/or performance predictor 140. Similarly, workload description generator 130 may be same as, or may represent, machine description generator 120 and/or performance predictor 140 while performance predictor 140 may be same as, or may represent, machine description generator 120, and/or workload description generator 130, according to various embodiments.

Program instructions 1220 may be encoded in platform native binary, any interpreted language such as Java™ byte-code, or in any other language such as C/C++, the Java™ programming language, etc., or in any combination thereof. In various embodiments, machine description generator 1222, or workload description generator 1224, and/or performance predictor 1226 may each be implemented in any of various programming languages or methods. For example, in one embodiment, machine description generator 1222, or workload description generator 1224, and/or performance predictor 1226 may be based on the Java programming language, while in other embodiments they may be written using the C or C++ programming languages. Similarly, machine description generator 1222, or workload description generator 1224, and/or performance predictor 1226 may be written using the Java programming language, C, C++, or another programming language, according to various embodiments. Moreover, in some embodiments, machine description generator 1222, or workload description generator 1224, and/or performance predictor 1226 may not be implemented using the same programming language. For example, machine description generator 1222, and/or workload description generator 1224 may be C++ based, while performance predictor 1226 may be developed using C.

Although the embodiments above have been described in considerable detail, numerous variations and modifications will become apparent to those skilled in the art once the above disclosure is fully appreciated. For example, although many of the embodiments are described in terms of particular types of operations that support synchronization within multi-threaded applications that access particular shared resources, it should be noted that the techniques and mechanisms disclosed herein for accessing and/or operating on shared resources may be applicable in other contexts in which applications access and/or operate on different types of shared resources than those described in the examples herein and in which different embodiments of the underlying hardware that supports persistent memory transactions described herein are supported or implemented. It is intended that the following claims be interpreted to embrace all such variations and modifications.

What is claimed is:

1. A method, comprising:

determining a thread allocation for a workload to optimize performance of the workload on a multi-core system, the determining comprising performing by one or more computing devices:

generating a machine description for the multi-core system, comprising:

executing one or more stress applications on the multi-core system to generate one or more performance indicators obtained from one or more machine performance counters of the multi-core system; and generating the machine description based at least in part on the one or more performance indicators;

generating a workload description for the multi-core system, comprising:

executing a plurality of profiling sessions of the workload on the multi-core system to generate one or more other performance indicators obtained from the one or more machine performance counters, wherein the workload differs from individual ones of the one or more stress applications, and wherein individual ones of the plurality of profiling sessions differ from other ones of the plurality of profiling sessions in thread placement for threads of the profiling sessions; and generating the workload description based at least in part on the one or more other performance indicators;

generating, for a plurality of different proposed thread placements of the multi-core system, a plurality of models of the workload according to the machine description, the workload description and respective ones of the different proposed thread placements, wherein at least a portion of the plurality of the different proposed thread placements differ from the thread placements of each of the plurality of profiling sessions in a number of proposed threads or respective proposed locations for execution of at least some of the proposed threads; and determining the thread allocation for the workload based on the plurality of models of the workload, wherein the thread allocation comprises a determined number of executing threads and respective locations for execution of at least some of the executing threads; and executing the workload on the multi-core system according to the determined thread allocation to optimize execution of the workload on the multi-core system.

2. The method of claim 1, wherein the machine description comprises bandwidth values for respective ones of a plurality of memory links, and wherein the workload description comprises bandwidth usage values for the respective ones of the plurality of memory links, and wherein determining the thread allocation comprises predicting respective workload bandwidth demands for individual ones of the plurality of different proposed thread placements, the respective workload bandwidth demands individually comprising respective bandwidth requirements for at least some of the plurality of memory links.

3. The method of claim 1, wherein generating the workload description comprises determining a single-thread execution time and bandwidth demands for a single thread.

4. The method of claim 1, wherein generating the workload description comprises determining an extent to which the workload can be re-balanced dynamically between the threads of the profiling sessions based on their progress.

5. The method of claim 1, wherein generating the workload description comprises determining a value indicating sensitivity to collocation of at least some of the threads of the profiling sessions in a core of the multi-core system.

6. The method of claim 1, further comprising modeling an expected hardware resource consumption for the plurality of different proposed thread placements of the multi-core system, wherein the expected hardware resource consumption comprises communication bandwidths at individual levels of a memory hierarchy of the multi-core system and compute resources within a core of the multi-core system.

7. The method of claim 1, further comprising:

determining an amount of bandwidth consumed by inter-socket communication; and modeling latency introduced by the inter-socket communication.

8. One or more non-transitory computer-accessible storage media storing program instructions that when executed on or across one or more computing devices cause the one or more computing devices to perform:

determining a thread allocation for a workload to optimize performance of the workload on a multi-core system, the determining comprising:

generating a machine description for the multi-core system, comprising:

executing one or more stress applications on the multi-core system to generate one or more performance indicators obtained from one or more machine performance counters of the multi-core system; and generating the machine description based at least in part on the one or more performance indicators;

generating a workload description for the multi-core system, comprising:

executing a plurality of profiling sessions of the workload on the multi-core system to generate one or more other performance indicators obtained from the one or more machine performance counters, wherein the workload differs from individual ones of the one or more stress applications, and wherein individual ones of the plurality of profiling sessions differ from other ones of the plurality of profiling sessions in thread placement for threads of the profiling sessions; and generating the workload description based at least in part on the one or more other performance indicators;

generating, for a plurality of different proposed thread placements of the multi-core system, a plurality of models of the workload according to the machine description, the workload description and respective ones of the different proposed thread placements, wherein at least a portion of the plurality of the different proposed thread placements differ from the thread placements of each of the plurality of profiling sessions in a number of proposed threads or respective proposed locations for execution of at least some of the proposed threads; and determining the thread allocation for the workload based on the plurality of models of the workload, wherein the thread allocation comprises a determined number of executing threads and respective locations for execution of at least some of the executing threads; and causing execution of the workload on the multi-core system according to the determined thread allocation to optimize execution of the workload on the multi-core system.

9. The one or more non-transitory computer-accessible storage media of claim 8, wherein the machine description comprises bandwidth values for respective ones of a plurality of memory links, and wherein the workload description comprises bandwidth usage values for the respective ones of the plurality of memory links, and wherein determining the thread allocation comprises predicting respective workload bandwidth demands for individual ones of the plurality of different proposed thread placements, the respective workload bandwidth demands individually comprising respective bandwidth requirements for at least some of the plurality of memory links.

10. The one or more non-transitory computer-accessible storage media of claim 8, wherein generating the workload description comprises determining a single-thread execution time and bandwidth demands for a single thread.

11. The one or more non-transitory computer-accessible storage media of claim 8, wherein generating the workload description comprises determining an extent to which the workload can be re-balanced dynamically between the threads of the profiling sessions based on their progress.

12. The one or more non-transitory computer-accessible storage media of claim 8, wherein generating the workload description comprises determining a value indicating sensitivity to collocation of at least some of the threads of the profiling sessions in a core of the multi-core system.

13. The one or more non-transitory computer-accessible storage media of claim 8, further comprising modeling an expected hardware resource consumption for the plurality of different proposed thread placements of the multi-core system, wherein the expected hardware resource consumption comprises communication bandwidths at individual levels of a memory hierarchy of the multi-core system and compute resources within a core of the multi-core system.

14. The one or more non-transitory computer-accessible storage media of claim 8, further comprising:

determining an amount of bandwidth consumed by inter-socket communication; and modeling latency introduced by the inter-socket communication.

15. A system, comprising:

one or more computing devices individually comprising at least one processor and memory; and a memory coupled to the one or more computing devices comprising program instructions executable by the one or more computing devices to implement a scheduler configured to determine a thread allocation for a workload to optimize performance of the workload on a multi-core system, wherein to determine the thread allocation the scheduler is configured to:

generate a machine description for a multi-core system based at least in part on one or more performance indicators obtained from one or more machine performance counters during execution of one or more stress applications on a multi-core system;

generate a workload description for the multi-core system based at least in part on one or more other performance indicators obtained from the one or more machine performance counters during execution of a plurality of profiling sessions of a workload on the multi-core system, wherein the workload differs from individual ones of the one or more stress applications, and wherein individual ones of the plurality of profiling sessions differ from other ones of the plurality of profiling sessions in thread placement for threads of the profiling sessions;

generate, for a plurality of different proposed thread placements of the multi-core system, a plurality of models of the workload according to the machine description, the workload description and respective ones of the different proposed thread placements, wherein at least a portion of the plurality of the different proposed thread placements differ from the thread placements of each of the plurality of profiling sessions in a number of proposed threads or respective proposed locations for execution of at least some of the proposed threads; and determine the thread allocation for the workload based on the plurality of models of the workload, wherein the thread allocation comprises a determined number of executing threads and respective locations for execution of at least some of the executing threads; and the multi-core system, comprising a plurality of processor cores and configured to:

execute the one or more stress applications to obtain the one or more performance indicators;

execute the plurality of profiling sessions to obtain the one or more other performance indicators; and execute the workload according to the determined thread allocation to optimize execution of the workload on the multi-core system.

16. The system of claim 15, wherein the machine description comprises bandwidth values for respective ones of a plurality of memory links, and wherein the workload description comprises bandwidth usage values for the respective ones of the plurality of memory links, and wherein to determine the thread allocation the scheduler is configured to predict respective workload bandwidth demands for individual ones of the plurality of different proposed thread placements, the respective workload bandwidth demands individually comprising respective bandwidth requirements for at least some of the plurality of memory links.

17. The system of claim 15, wherein generating the workload description comprises determining a single-thread execution time and bandwidth demands for a single thread.

18. The system of claim 15, wherein generating the workload description comprises determining an extent to which the workload can be re-balanced dynamically between the threads of the profiling sessions based on their progress.

19. The system of claim 15, wherein generating the workload description comprises determining a value indicating sensitivity to collocation of at least some of the threads of the profiling sessions in a core of the multi-core system.

20. The system of claim 15, the scheduler further configured to model an expected hardware resource consumption for the plurality of different proposed thread placements of the multi-core system, wherein the expected hardware resource consumption comprises communication bandwidths at individual levels of a memory hierarchy of the multi-core system and compute resources within a core of the multi-core system.

* * * * *